United States Patent
Oh et al.

(10) Patent No.: US 8,557,627 B2
(45) Date of Patent: Oct. 15, 2013

(54) METHODS OF FORMING A PHASE CHANGE LAYER AND METHODS OF FABRICATING A PHASE CHANGE MEMORY DEVICE INCLUDING THE SAME

(71) Applicants: Jin-Ho Oh, Seongnam-si (KR);
Jeong-Hee Park, Hwaseong-si (KR);
Man-Sug Kang, Suwon-si (KR);
Byoung-Deog Choi, Suwon-si (KR);
Gyu-Hwan Oh, Hwaseong-si (KR);
Hye-Young Park, Seongnam-si (KR);
Doo-Hwan Park, Yongin-si (KR)

(72) Inventors: Jin-Ho Oh, Seongnam-si (KR);
Jeong-Hee Park, Hwaseong-si (KR);
Man-Sug Kang, Suwon-si (KR);
Byoung-Deog Choi, Suwon-si (KR);
Gyu-Hwan Oh, Hwaseong-si (KR);
Hye-Young Park, Seongnam-si (KR);
Doo-Hwan Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/752,310

(22) Filed: Jan. 28, 2013

(65) Prior Publication Data
US 2013/0143380 A1    Jun. 6, 2013

Related U.S. Application Data

(62) Division of application No. 12/979,895, filed on Dec. 28, 2010, now abandoned.

(30) Foreign Application Priority Data

Dec. 29, 2009  (KR) .......................... 10-2009-0132290
Dec. 9, 2010   (KR) .......................... 10-2010-0125403

(51) Int. Cl.
*H01L 29/02*    (2006.01)

(52) U.S. Cl.
USPC ............... 438/102; 438/103; 438/104; 257/2; 257/3; 257/4; 257/5; 257/E29.002

(58) Field of Classification Search
USPC .................................................. 438/102–104
See application file for complete search history.

(56) References Cited

U.S. PATENT DOCUMENTS

| 6,858,465 B2 | 2/2005 | Li et al. |
|---|---|---|
| 2007/0097739 A1 | 5/2007 | Happ et al. |
| 2007/0272950 A1 | 11/2007 | Kim et al. |
| 2008/0142777 A1 | 6/2008 | Park et al. |
| 2010/0283029 A1* | 11/2010 | Dennison et al. ................. 257/3 |

FOREIGN PATENT DOCUMENTS

| JP | 05-334881 | 12/1993 |
|---|---|---|
| KR | 1020040032975 A | 4/2004 |
| KR | 100695168 B1 | 3/2007 |
| KR | 100755805 B1 | 8/2007 |
| KR | 1020080046014 A | 5/2008 |
| KR | 1020090117103 A | 11/2009 |

* cited by examiner

*Primary Examiner* — Jami M Valentine
(74) *Attorney, Agent, or Firm* — Myers Bigel Sibley & Sajovec, P.A.

(57) ABSTRACT

A phase change structure includes a first phase change material layer pattern and a second phase change material layer pattern. The first phase change material layer pattern may partially fill a minute structure, and the second phase change material layer pattern may fully fill the minute structure. The first phase change material layer pattern may include a first phase change material, and the second phase change material layer pattern may include a second phase change material having a composition substantially different from a composition of the first phase change material.

20 Claims, 9 Drawing Sheets

METHODS OF FORMING A PHASE CHANGE LAYER AND METHODS OF FABRICATING A PHASE CHANGE MEMORY DEVICE INCLUDING THE SAME

CLAIM OF PRIORITY

This application is a divisional of U.S. patent application Ser. No. 12/979,895, filed on Dec. 28, 2010 in the United States Patent and Trademark Office, and claims priority to Korean Patent Applications No. 10-2009-0132290, filed on Dec. 29, 2009 and No. 10-2010-0125403, filed on Dec. 9, 2010 in the Korean Intellectual Property Office (KIPO), the contents of which are incorporated herein by reference in their entireties.

BACKGROUND

1. Field

Example embodiments according to the inventive concept according to the inventive concept relate to a phase change structure, a method of forming a phase change structure, a phase change memory device and a method of manufacturing a phase change memory device. More particularly, example embodiments according to the inventive concept according to the inventive concept relate to a phase change structure including a phase change layer that may completely fill a minute structure, a method of forming the phase change layer, a phase change memory device including the phase change structure, and a method of manufacturing the phase change memory device.

2. Description of the Related Art

A phase change memory device has random access characteristics, so the phase change memory device may be widely employed in various electric and electronic apparatuses. As for the phase change memory device, data may be recorded into the phase change memory or the data may be read from the phase change memory device using phase transition of a chalcogenide compound in a phase change material layer of the phase change memory device. That is, the data may be recorded or read using resistance difference between amorphous state and crystalline state of the chalcogenide compound. For example, the data may be stored into the phase change memory device as a state of "0" or "1" in accordance with the reversible phase transition of the chalcogenide compound in the phase change material layer. When the phase transition of the phase change material layer becomes apparent, the phase change memory device may ensure improved reliability.

When design rule of the phase change memory device is reduced, the phase change material layer may not completely fill up a minute structure such as a minute hole, a minute opening or a minute trench without generating a void or a seam in the phase change material layer. As the phase change memory device is highly integrated, a phase change material layer should fully fill up a minute three dimensional structure without any defect such as a void, a seam or an overhang.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

According to example embodiments according to the inventive concept, there is provided a phase change structure including a first phase change material layer pattern and a second phase change material layer pattern. The first phase change material layer pattern may partially fill a high aspect ratio structure provided on an object or a substrate. The first phase change material layer pattern may include a first phase change material. The second phase change material layer pattern may completely fill the high aspect ratio structure. The second phase change material layer pattern may include a second phase change material. The second phase change material may have a composition substantially different from a composition of the first phase change material.

Other methods and devices according to embodiments of the inventive concept will be or become apparent to one with skill in the art upon review of the following drawings and detailed description. It is intended that all such additional methods and/or devices be included within this description, be within the scope of the present inventive concept, and be protected by the accompanying claims.

BRIEF DESCRIPTION OF THE DRAWINGS

Example embodiments according to the inventive concept will be more clearly understood from the following detailed description taken in conjunction with the accompanying drawings.

FIGS. 1 to 3 are cross sectional views illustrating a method of forming a phase change layer in accordance with example embodiments according to the inventive concept.

FIGS. 4 to 6 are cross sectional views illustrating a method of forming a phase change layer in accordance with example embodiments according to the inventive concept.

FIGS. 7 and 8 are cross sectional views illustrating a method of forming a phase change structure in accordance with example embodiments according to the inventive concept.

FIGS. 9 to 13 are cross sectional views illustrating a method of manufacturing a phase memory device in accordance with example embodiments according to the inventive concept.

FIGS. 14 to 16 are cross sectional views illustrating a method of manufacturing a phase memory device in accordance with example embodiments according to the inventive concept.

FIG. 17 is a block diagram illustrating a memory system in accordance with example embodiments according to the inventive concept.

FIG. 18 is a block diagram illustrating a communication system in accordance with example embodiments according to the inventive concept.

DESCRIPTION OF EMBODIMENTS ACCORDING TO THE INVENTIVE CONCEPT

Figure 1:
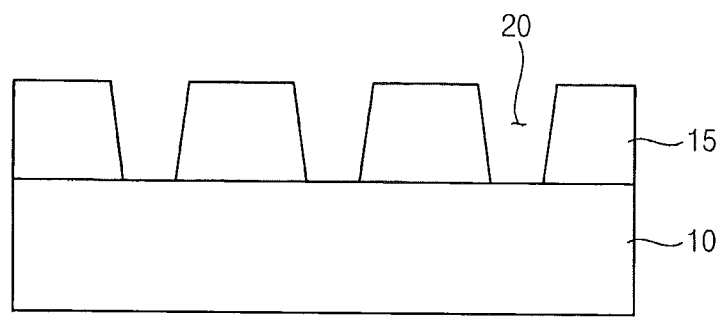
FIGS. 1 to 18 represent non-limiting, example embodiments according to the inventive concept as described herein.

Various example embodiments according to the inventive concept will be described more fully hereinafter with reference to the accompanying drawings, in which some example embodiments according to the inventive concept are shown. The present inventive concept may, however, be embodied in many different forms and should not be construed as limited to the example embodiments according to the inventive concept set forth herein. Rather, these example embodiments according to the inventive concept are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments according to the inventive concept only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments according to the inventive concept are described herein with reference to cross-sectional illustrations that are schematic illustrations of idealized example embodiments according to the inventive concept (and intermediate structures). As such, variations from the shapes of the illustrations as a result, for example, of manufacturing techniques and/or tolerances, are to be expected. Thus, example embodiments according to the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, there will be described phase change material layers, phase change structures and methods of forming phase change material layers in accordance with example embodiments according to the inventive concept.

According to example embodiments according to the inventive concept, a phase change layer may be obtained utilizing an in-situ reflow mechanism. As for the in-situ reflow mechanism, ingredients included in a film or a layer may actively diffused at a surface of the film or the layer and also surface energy of the film and the layer may be reduced according to increasing a process temperature for forming the film or the layer on an object such as substrate. In other words, when the film or the layer is obtained utilizing the in-situ reflow mechanism, surface diffusion of the ingredients in the film or the layer may increases and driving force for decreasing the surface energy of the film or the layer may occur by reducing a surface area of the film or the layer. The phase change material layer obtained through the in-situ reflow mechanism may provide desired step coverage or a gap fill characteristic, so that the phase change material layer may effectively fill a three dimensional minute structure (ie. a high aspect ratio structure) while reducing defects in the phase change material layer even though the minute structure has a relatively large depth and a relatively small width (i.e., a high aspect ratio). Namely, the phase change material layer may completely fill various minute structures such as a minute contact hole, a minute via hole, a minute opening or a minute trench without generating a void, a seam or an overhang in the phase change material layer when the phase change material layer is formed using the in-situ reflow mechanism. In some embodiments according to the inventive concept, the term "minute" refers to structures having a high aspect ration where, for example, a depth of the structure is much greater than a width of the opening of the structure. For example, high aspect ratio structures can be those having a depth of about 1,200 Å, an opening width of about 700 Å and a width at a bottom of the structure of about 300 Å. Therefore, the aspect ratio of such structures can be defined relative to the width of the opening of the structure or relative to the width of the bottom of the structure compared to the depth. For example, the aspect ratio can be, in some embodiments according to the inventive concept, about 1.7 (for the aspect ratio defined relative to the opening) or about 4.0 (for the aspect ratio defined relative to the bottom).

In example embodiments according to the inventive concept, the phase change material layer may include a phase change material that includes at least two kinds of elements in Group XIV, elements in Group XV and elements in Group XVI. For example, the phase change material layer may include a binary compound containing the elements in Groups XIV, XV and XVI, a ternary compound containing the elements in Groups XIV, XV and XVI, a quaternary compound containing the elements in Groups XIV, XV and XVI, a quinary compound containing the elements in Groups XIV, XV and XVI, etc. Examples of the elements in Group XIV may include germanium (Ge), silicon (Si), tin (Sn), lead (Pb), etc. Example of the elements in Group XV may include arsenic (As), antimony (Sb), bismuth (Bi), etc. Examples of the elements in Group XVI may include sulfur (S), selenium (Se), tellurium (Te), etc.

According to example embodiments according to the inventive concept, the phase change material may include a chalcogenide compound. For example, the phase change material may include the binary compound that contains a compound containing arsenic-sulfur (As—S), a compound containing antimony-germanium (Sb—Ge), a compound containing antimony-selenium (Sb—Se), a compound containing antimony-tellurium (Sb—Te), etc. In some example embodiments according to the inventive concept, the phase change material may include the ternary compound that contains a compound containing germanium-antimony-selenium (Ge—Sb—Se), a compound containing germanium-antimony-tellurium (Ge—Sb—Te), etc. Here, the compound containing arsenic-surface may be referred to as a sulfur based chalcogenide compound. The compound containing germanium-antimony-selenium and the compound containing antimony-selenium may be referred to as in a selenium based chalcogenide compound. Additionally, the compound containing antimony-tellurium and the compound containing germanium-antimony-tellurium may be referred to as in a tellurium based chalcogenide compound.

In some example embodiments according to the inventive concept, the phase change material may include a non-chalcogenide compound. For example, the phase change material may include a compound containing germanium-antimony (Ge—Sb).

In some example embodiments according to the inventive concept, the phase change material may include a chalcogenide compound having a dopant or a non-chalcogenide compound having a dopant. For example, the phase change material may include the above-described chalcogenide compound containing a dopant or the above-mentioned non-chalcogenide compound containing a dopant. Examples of the dopant in the phase change material may include indium (In), tin (Sn), bismuth (Bi), carbon (C), nitrogen (N), oxygen (O), boron (B), silicon (Si), germanium (Ge), aluminum (Al), etc. These may be used alone or in a combination thereof. When the phase change material layer additionally includes the dopant, the phase change material layer may have an increased crystallization temperature. Thus, the phase change material layer may not be easily crystallized in processes for manufacturing a phase change memory device including the phase change material layer. The phase change material layer may include about 5 percent (%) to about 30% by weight of the dopant based on a total weight of the phase change material layer. Here, the phase change material layer may have a crystallization temperature above about 200° C. Therefore, deterioration of the phase change material layer may be effectively reduced in the processes of manufacturing the phase change memory device having the phase change material layer.

According to example embodiments according to the inventive concept, the phase change material layer may be obtained by a physical vapor deposition (PVD) process. For example, the phase change material layer may be formed by a sputtering process using a source target that includes the ingredients of the phase change material.

Figure 2:
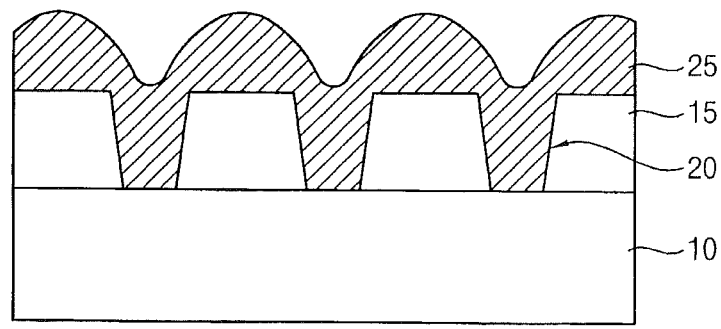
Figure 3:
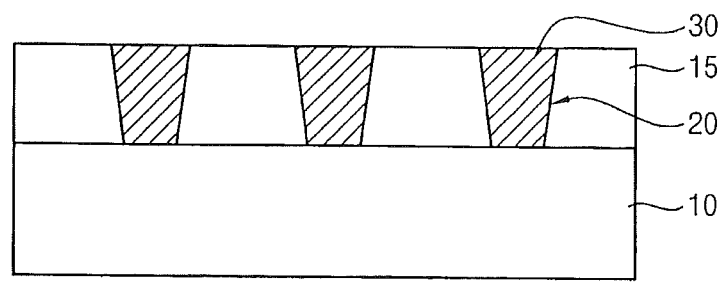

FIGS. 1 to 3 are cross sectional views illustrating a method of forming a phase change layer in accordance with example embodiments according to the inventive concept.

Referring to FIG. 1, an insulation structure 15 is formed on an object 10. The object 10 may include a semiconductor substrate, a substrate having a semiconductor layer, an insulation substrate, a metal oxide substrate, etc. For example, the object 10 may include a silicon (Si) substrate, a germanium (Ge) substrate, a silicon-on-insulator (SOI) substrate, a germanium-on-insulator (GOI) substrate, a glass substrate, a plastic substrate, am aluminum oxide (AlOx) substrate, a titanium oxide (TiOx) substrate, etc. These may be used alone or in a combination thereof. The object 10 may additionally include various elements such as a conductive pattern, an electrode, a pad, a contact, a contact region, an insulation pattern, etc., which are provided on a substrate.

The insulation structure 15 may include an oxide, a nitride and/or an oxynitride. For example, the insulation structure 15 may include silicon oxide (SiOx), silicon nitride (SiNx) and/or silicon oxynitride (SiOxNy). Examples of the oxide in the insulation structure 15 may include boro-phosphor silicate glass (BPSG), phosphor silicate glass (PSG), undoped silicate glass (USG), spin on glass (SOG), flowable oxide (FOX), tetra ethyl ortho silicate (TEOS), plasma enhanced-tetra ethyl ortho silicate (PE-TEOS), high density plasma-chemical vapor deposition (HDP-CVD) oxide, etc. These may be used alone or in a mixture thereof.

In example embodiments according to the inventive concept, the insulation structure 15 may have a single layer structure or a multi layer structure. For example, the insulation structure 15 may include at least one of an oxide layer, a nitride layer and an oxynitride layer.

In some example embodiment, the insulation structure 15 may have a level surface obtained by a planarization process. For example, an upper portion of the insulation structure 15 may be planarized by a chemical mechanical polishing (CMP) process, an etch-back process, etc.

According to example embodiments according to the inventive concept, a lower structure may be provided on the object 10. The lower structure may include a conductive region, a conductive pattern, an insulation pattern, a switching device, etc. For example, the conductive region of the lower structure may include an impurity region, a diffusion region, etc. The switching device of the lower structure may include a diode, a transistor, etc. The insulation structure 15 may be formed on the object 10 to sufficiently cover the lower structure when the lower structure is provided on the object 10.

The insulation structure 15 is etched to form a minute structure 20 that partially exposes the object 10. The minute structure 20 may include a minute contact hole, a minute via hole, a minute opening, a minute trench, etc. The minute structure 20 may exposes at least a portion of the object 10 and/or the lower structure. For example, the minute structure 20 may expose at least a portion of the conductive region, the conductive pattern, the switching device, etc.

The minute structure 20 may be formed through the insulation structure 15 by partially etching the insulation layer 15. For example, the minute structure 200 may be formed by a photolithography process. In some example embodiments according to the inventive concept, an additional mask such as a hard mask may be provided on the insulation structure 15, and the insulation structure 15 may be etched using the additional mask as an etching mask, to thereby form the minute structure 20 through the insulation structure 15. Here, the additional mask may be formed using a material that has an etching selectivity relative to the insulation structure 15. For example, the additional mask may include a nitride, an oxynitride and/or an organic material.

In example embodiments according to the inventive concept, the minute structure 20 may have a lower width substantially smaller that an upper width thereof. That is, the minute structure 20 may have a sidewall inclined relative to the object 10 by a predetermined angle, so that the upper width of the minute structure 20 may be substantially larger than the lower width of the minute structure 20. Alternatively, the minute structure 20 may have a sidewall substantially perpendicular with respect to the object 10. Namely, the minute structure 20 may have a lower width substantially the same as or substantially similar to an upper width of the minute structure 20.

Referring to FIG. 2, a phase change material layer 25 is formed on the insulation structure 15 to fill up the minute structure 20. The phase change material layer 25 may be formed using the above-described phase change material that includes the binary compound containing the elements in Groups XIV, XV and XVI, the ternary compound containing the elements in Groups XIV, XV and XVI, the quaternary compound containing the elements in Groups XIV, XV and XVI, the quinary compound containing the elements in Groups XIV, XV and XVI, etc. In example embodiments according to the inventive concept, the phase change material layer 25 may be formed using the phase change material that includes the chalcogenide compound or the non-chalcogenide compound. In some example embodiments according to the inventive concept, the phase change material layer 25 may be formed using the phase change material that includes the chalcogenide containing the dopant or the non-chalcogenide compound containing the dopant.

According to example embodiments according to the inventive concept, the phase change material layer 25 may be obtained by a physical vapor deposition (PVD) process employing the above-described in-situ reflow mechanism. For example, the phase change material layer 25 may be obtained by a sputtering process performed at a relatively high temperature above about 60% of a melting point temperature of the phase change material. Thus, the phase change material layer 25 may fully fill up the minute structure 20 without generating defects such as voids or seams in the phase change material layer 25. When the phase change material layer 25 is formed by adopting the in-situ reflow mechanism, ingredients in a surface of the phase change material layer 25 may be more diffused and surface energy of the phase change material layer 25 may be reduced. As a result, the phase change material layer 25 may be protruded over the insulation structure 15 as a substantially hemi-spherical shape, a substantially dome shape, a substantially oval shape, etc., while reducing overhangs of the phase change material layer 25 adjacent at an upper portion of the minute structure 20. That is, an upper portion of the phase change material layer 25 may have the substantially hemi-spherical shape, the substantially dome shape, the substantially oval shape, etc. The phase change material layer 25 having the above structure may be obtained by increasing a process temperature and by reducing an applied power in the sputtering process for forming the phase change material layer 25.

When a phase change material layer (pattern) is formed by a PVD process, the phase change material layer (pattern) may not generally have a step coverage substantially superior to that of a phase change material layer (pattern) obtained by a chemical vapor deposition (CVD) process. Hence, the phase change material layer (pattern) obtained by the PVD process may not completely fill a three dimensional minute structure such as a minute via hole, a minute contact hole, a minute opening or a minute trench without generating a void or a seam in the phase change material layer (pattern). However, the phase change material layer (pattern) formed by the PVD process may have a density and a purity substantially superior to those of the phase change material layer (pattern) formed by the CVD process. Ingredients of a phase change material may be chemically reacted to form the phase change material layer (pattern) in the CVD process whereas ingredients of a phase change material may be directly separated from a source target to form the phase change material layer (pattern) in the PVD process. Thus, the phase change material layer (pattern) may have an excellent purity and a good density through the PVD process. As a result, the phase change material layer (pattern) obtained by the PVD process may easily cause a phase transition by an applied current, and also the phase change material layer (pattern) formed by the PVD process may durably maintain the phase transition generated therein in comparison with the phase change material layer (pattern) obtained by the CVD process. According to example embodiments according to the inventive concept, the phase change material layer 25 may ensure a high density and purity and may completely fill the minute structure 20 without any defects such as the void, the seam or the overhang when the phase change material layer 25 is formed by the PVD process utilizing the in-situ reflow mechanism.

In example embodiments according to the inventive concept, the phase change material layer 25 may be formed on the insulation structure 15 by sufficiently filling the minute structure 20 through the sputtering process. As for the sputtering process for forming the phase change material layer 25, at least one source target and the object 10 may be loaded into a chamber. The at least one source target may include ingredients of a phase change material included in the phase change material layer 25. The source target may be disposed to substantially face with the object 10 in the chamber. The object 10 having the insulation structure 15 may be placed on a supporting member, for example, an electrostatic chuck. The chamber may have a very low base pressure substantially similar to a vacuum pressure. For example, the chamber may have a based pressure of about $10^{-8}$ Torr. A sputtering gas may be introduced in the chamber. The sputtering gas may include an inactive gas such as an argon (Ar) gas, a helium (He) gas, etc. The pressure of the chamber may vary when the sputtering gas is provided into the chamber. When the at least one source target is electrically biased, the sputtering gas including the inactive gas may have a plasma state. Ions of the sputtering gas having a positive (+) charge may reach the biased source target having a negative (−) charge. Therefore, the ingredients in the source target may be sputtered toward the object 10 having the minute structure 20 to form the phase change material layer 25 on the object 10 and the insulation structure 15.

In the sputtering process of forming the phase change material layer 25 on the insulation structure 15, the phase change material layer 25 may have an increased crystallization temperature by controlling growth of grains in the phase change material. For example, a composition of the source target including the ingredients may be changed or the dopant may be added into the source target or the phase change material layer 25 to obtain the phase change material layer having a crystallization temperature above about 200° C.

In example embodiments according to the inventive concept, contents of ingredients in the chalcogenide compounds or the non-chalcogenide compounds may be adjusted to control the crystallization temperature of the phase change material layer 25.

In some example embodiments according to the inventive concept, the dopant may be directly added into the source target or a gas including the dopant may be provided into the chamber in the sputtering process for forming the phase change material layer 25, to thereby control the crystallization temperature of the phase change material layer 25.

In some example embodiments according to the inventive concept, the phase change material layer 25 may have an enhanced crystallization temperature by using a source target including the ingredients of the phase change material with the dopant and by providing a gas including the dopant while forming the phase change material layer 25.

As described above, the growth of the grains in the phase change material of the phase change material layer 25 may be controlled by adjusting the crystallization temperature of the phase change material layer 25. Hence, the phase change material layer 25 may effectively fill the minute structure 20 without causing the overhang at a portion of the phase change material layer 25 adjacent to an upper portion of the minute structure 20. The grains in the phase change material of the phase change material layer 25 may have widths substantially smaller than or substantially similar to a width of the minute structure 20. For example, the grains in the phase change material of the phase change material layer 25 may have a size below about 30 nm.

In example embodiments according to the inventive concept, the phase change material layer 25 may be obtained by the PVD process executed at a process temperature above about 60% of a melting point temperature of the phase change material. For example, the phase change material layer 25 may be formed on the insulation structure 15 having the minute structure 20 while maintaining the process temperature above about 60% of a melting point temperature of the chalcogenide compound or the non-chalcogenide compound. In some example embodiments according to the inventive concept, the process temperature of the PVD process for forming the phase change material layer 25 may be in a range of about 60% to about 100% of the melting point temperature of the phase change material. The process temperature of the PVD process according to example embodiments according to the inventive concept may be larger than that of the conventional PVD process, such that the phase change material layer 25 may have an enhanced step coverage or gap filling characteristic by increasing surface diffusion of the ingredients in the phase change material and by reducing surface energy of the phase change material.

In the sputtering process according to example embodiments according to the inventive concept, a temperature of the object 10 may be controlled by a heat generated from the source target while forming the phase change material layer 25. Alternatively, the temperature of the object 10 may be adjusted by controlling a temperature of the supporting member on which the object 10 is positioned. In some example embodiments according to the inventive concept, an additional heating member may be provided to control the process temperature in the chamber, so that the phase change material layer 25 may be formed at the process temperature above about 60% of the melting point temperature of the phase change material.

According to example embodiments according to the inventive concept, the phase change material layer 25 may completely fill the minute structure 20 without the void, the seam or the overhang by increased surface diffusion of the ingredients in the phase change material layer and by reduced surface energy of the phase change material when the phase change material layer 25 is formed on a bottom and the sidewall of the minute structure 20 at the relatively high temperature above about 60% of the melting point temperature of the phase change material. Here, the upper portion of the phase change material layer 25 may be protruded over the insulation structure 15 as the substantially dome shape, the substantially circular hemi-spherical shape, the substantially oval hemi-spherical shape, etc.

In example embodiments according to the inventive concept, the phase change material may be deposited on the object 10 and the insulation structure 15 by a deposition rate of about 1 Å/sec to about 50 Å/sec. For example, the phase change material layer 25 may be formed by a deposition rate below about 5 Å/sec. When the phase change material layer 25 is formed by a relatively high deposition rate, the ingredients in the phase change material may not be sufficiently diffused at the surface of the phase change material layer 25, so that the overhang may be generated at a portion of the phase change material layer 25 in the minute structure 20. In case that the phase change material layer 25 is obtained by the deposition rate below about 5 Å/sec, the surface diffusion of the ingredients in the phase change material may be sufficiently generated, so that the phase change material may be sequentially deposited at the bottom of the minute structure 20. Thus, the phase change material layer 25 may be completely fill the minute structure 20 without the void or the seam caused by the overhang of the phase change material adjacent to the upper portion of the minute structure 20.

In example embodiments according to the inventive concept, the phase change material layer 25 may be obtained by applying a power of about 0.1 W/cm$^2$ to about 5 W/cm$^2$ to the source target in the sputtering process. When the applied power is below about 0.1 W/cm$^2$, the phase change material layer 25 may have an undesirably low deposition rate or the plasma for forming the phase change material layer 25 may not be generated in the chamber. In case that the applied power is above about 5 W/cm$^2$, the surface diffusion of the ingredients in the phase change material may not be sufficiently caused. According to example embodiments according to the inventive concept, the phase change material layer 25 may effectively fill the minute structure 20 without the void, the seam or the overhang by the sufficient surface diffusion of the ingredients in the phase change material because the phase change material layer 25 may be obtained at lower power level than that of the conventional sputtering process.

In example embodiments according to the inventive concept, the phase change material layer 25 may be formed under a relatively low process pressure of about 0.05 mTorr to about 10 mTorr. When the chamber has a process power below about 0.05 mTorr, the plasma for forming the phase change material layer 25 may not be sufficiently generated or the generated plasma may be unstable in the chamber. When the chamber has a process power above about 10 mTorr, the ingredients of the phase change material may not go straight toward the object 10 from the source target. Thus, the phase change material layer 25 in the minute structure 20 may cause the defects.

In example embodiments according to the inventive concept, the source target may be spaced apart from the object 10 by a distance of about 50 mm to about 500 mm while forming the phase change material layer 25. When a distance between the object 10 and the source target is below about 50 mm, the ingredients of the phase change material may not go straight toward the object 10 to thereby cause the defects of the phase change material layer 25 in the minute structure 20. In case that the distance between the object 10 and the source target is above about 500 mm, the plasma for forming phase change material layer 25 may not properly generated or the generated plasma may be unstable in the chamber.

In some example embodiments according to the inventive concept, a magnetron may be disposed at a lateral portion of the chamber, so that the ingredients of the phase change material may easily go straight toward the object 10 form the source target. Therefore, the phase change material layer 25 may be uniformly formed on the object 10 and the insulation structure 15.

Referring to FIG. 3, the phase change material layer 25 is partially removed until the insulation structure 15 is exposed. That is, an upper portion of the phase change material layer 25 on the insulation structure 15 may be removed. Thus, a phase change structure including phase change material layer pattern 30 is provided in the minute structure 20. For example, the phase change material layer pattern 30 may be obtained by a CMP process, an etch-back process, etc. In some example embodiments according to the inventive concept, the phase change structure may include an additional material layer pattern such as a wetting layer pattern and/or a seed layer pattern besides the phase change material layer pattern 30.

When a phase change memory device includes the phase change structure, the phase change memory device may ensure improved resistance margin between a set state and a reset state of the phase change memory device.

Hereinafter, methods of forming phase change material layers according to Examples and Comparative Examples will be described.

Example 1

A trench having a line shape was formed on an object. The trench had a depth of about 1,200 Å. The trench also had a lower width of about 300 Å and an upper width of about 700 Å. To form a phase change material layer filling the trench, a source target including nitrogen (N), germanium (Ge), antimony (Sb) and tellurium (Te) was used. The source target included about 5% to about 30% by weight of nitrogen, about 15% to about 30% by weight of germanium, about 15% to about 30% by weight of antimony. Further, the source target included about 45% to about 65% by weight of tellurium.

The phase change material layer was obtained at a temperature of about 60% of about 600° C. (a melting point temperature of the source target). While forming the phase change material layer, a bias power of about 100 W to about 5 KW was applied to the source target. A chamber for forming the phase change material layer had a process pressure of about 0.05 mTorr to about 10 mTorr. The phase change material layer completely filled the line-shaped trench without any defects such as voids, seams, over hangs, etc.

Example 2

A trench having a line shape was formed on an object. The trench had a depth of about 1,200 Å, a lower width of about 300 Å and an upper width of about 700 Å. To form a phase change material layer filling the trench, a source target including oxygen (O), germanium, antimony and tellurium was used in a sputtering process. The source target included about 5% to about 30% by weight of oxygen, about 15% to about 30% by weight of germanium, about 15% to about 30% by weight of antimony. Further, the source target included about 45% to about 65% by weight of tellurium.

The phase change material layer was obtained at a temperature of about 60% of about 610° C. (a melting point temperature of the source target). While forming the phase change material layer, a bias power of about 100 W to about 5 KW was applied to the source target in the sputtering process. A chamber for forming the phase change material layer had a process pressure of about 0.05 mTorr to about 10 mTorr. The phase change material layer filled up the trench without any defects such as voids, seams, over hangs, etc.

Example 3

A trench having a line shape was formed on an object. The trench had a depth of about 1,200 Å, a lower width of about 300 Å and an upper width of about 700 Å. To form a phase change material layer filling the trench, a source target including boron (B), germanium, antimony and tellurium was used in a sputtering process. The source target included about 5% to about 30% by weight of boron and about 15% to about 30% by weight of germanium. Further, the source target included about 15% to about 30% by weight of antimony and about 45% to about 65% by weight of tellurium.

The phase change material layer was obtained at a temperature of about 60% of about 590° C. (a melting point temperature of the source target). While forming the phase change material layer, a bias power of about 100 W to about 5 KW was applied to the source target. A chamber for forming the phase change material layer had a process pressure of about 0.05 mTorr to about 10 mTorr. The phase change material layer filled the line-shaped without any defects such as voids, seams, over hangs, etc.

Example 4

A trench having a line shape was formed on an object. The trench had a depth of about 1,200 Å, a lower width of about 300 Å and an upper width of about 700 Å. To form a phase change material layer filling the trench, a source target including silicon (Si), germanium, antimony and tellurium was used in a sputtering process. The source target included about 5% to about 30% by weight of silicon, about 15% to about 30% by weight of germanium, about 15% to about 30% by weight of antimony. Additionally, the source target included about 45% to about 65% by weight of tellurium.

The phase change material layer was obtained at a temperature of about 60% of about 620° C. (a melting point temperature of the source target). While forming the phase change material layer, a bias power of about 100 W to about 5 KW was applied to the source target. A chamber for forming the phase change material layer had a process pressure of about 0.05 mTorr to about 10 mTorr. The phase change material layer filled the line-shaped trench without any defects such as voids, seams, over hangs, etc.

Example 5

A trench having a line shape was formed on an object. The trench had a depth of about 1,200 Å, a lower width of about 300 Å and an upper width of about 700 Å. To form a phase change material layer filling the trench, a source target including iron (Fe), germanium (Ge), antimony (Sb) and tellurium (Te) was used in a sputtering process. The source target included about 5% to about 30% by weight of iron and about 15% to about 30% by weight of germanium. Additionally, the source target included about 15% to about 30% by weight of antimony and about 45% to about 65% by weight of tellurium.

The phase change material layer was obtained at a temperature of about 60% of about 610° C. (a melting point temperature of the source target) by the sputtering process. While forming the phase change material layer, a bias power of about 100 W to about 5 KW was applied to the source target. A chamber for forming the phase change material layer had a process pressure of about 0.05 mTorr to about 10 mTorr.

The phase change material layer filled the line-shaped trench without any defects such as voids, seams, over hangs, etc.

Example 6

A trench having a line shape was formed on an object. The trench had a depth of about 1,200 Å, a lower width of about 300 Å and an upper width of about 700 Å. To form a phase change material layer filling the trench, a source target including carbon (C), germanium, antimony and tellurium was used. The source target included about 5% to about 30% by weight of carbon, about 15% to about 30% by weight of germanium, about 15% to about 30% by weight of antimony. Additionally, the source target included about 45% to about 65% by weight of tellurium.

The phase change material layer was obtained at a temperature of about 60% of about 605° C. (a melting point temperature of the source target). While forming the phase change material layer, a bias power of about 100 W to about 5 KW was applied to the source target in the sputtering process. A chamber for forming the phase change material layer had a process pressure of about 0.05 mTorr to about 10 mTorr. The phase change material layer completely filled the trench without any defects such as voids, seams, over hangs, etc.

Example 7

A trench having a line shape was formed on an object. The trench had a depth of about 1,200 Å, a lower width of about 300 Å and an upper width of about 700 Å. To form a phase change material layer filling the trench, a source target including aluminum (Al), germanium, antimony and tellurium was used. The source target included about 5% to about 30% by weight of aluminum and about 15% to about 30% by weight of germanium. Further, the source target included about 15% to about 30% by weight of antimony and about 45% to about 65% by weight of tellurium.

The phase change material layer was obtained at a temperature of about 60% of a (actual temperature observed?) melting point temperature of the source target. While forming the phase change material layer, a bias power of about 100 W to about 5 KW was applied to the source target in the sputtering process. A chamber for forming the phase change material layer had a process pressure of about 0.05 mTorr to about 10 mTorr. The phase change material layer fully filled the trench without any defects such as voids, seams, over hangs, etc.

Example 8

A trench having a line shape was formed on an object. The trench had a depth of about 1,200 Å, a lower width of about 300 Å and an upper width of about 700 Å. To form a phase change material layer filling the trench, a source target including bismuth (Bi), germanium, antimony and tellurium was used. The source target included about 5% to about 30% by weight of bismuth and about 15% to about 30% by weight of germanium. Additionally, the source target included about 15% to about 30% by weight of antimony and about 45% to about 65% by weight of tellurium.

The phase change material layer was obtained at a temperature of about 60% of about 585° C. (a melting point temperature of the source target). While forming the phase change material layer, a bias power of about 100 W to about 5 KW was applied to the source target in a sputtering process. A chamber for forming the phase change material layer had a process pressure of about 0.05 mTorr to about 10 mTorr. The phase change material layer sufficiently filled the line-shaped trench without any defects such as voids, seams, over hangs, etc.

Example 9

A trench having a line shape was formed on an object. The trench had a depth of about 1,200 Å, a lower width of about 300 Å and an upper width of about 700 Å. To form a phase change material layer filling the trench, a source target including indium (In), germanium, antimony and tellurium was used in a sputtering process. The source target included about 5% to about 30% by weight of indium, about 15% to about 30% by weight of germanium, about 15% to about 30% by weight of antimony. Additionally, the source target included about 45% to about 65% by weight of tellurium.

The phase change material layer was obtained at a temperature of about 60% of about 580° C. (a melting point temperature of the source target). While forming the phase change material layer, a bias power of about 100 W to about 5 KW was applied to the source target in the sputtering process. A chamber for forming the phase change material layer had a process pressure of about 0.05 mTorr to about 10 mTorr. The phase change material layer completely filled the trench without any defects such as voids, seams, over hangs, etc.

Comparative Example 1

A trench having a line shape was formed on an object. The trench had a depth of about 1,200 Å. The trench also had a lower width of about 300 Å and an upper width of about 700 Å. To form a phase change material layer on the trench, a source target including indium, germanium, antimony and tellurium was used in a sputtering process. The source target included about 5% to about 30% by weight of indium, about 15% to about 30% by weight of germanium, about 15% to about 30% by weight of antimony. Further, the source target included about 45% to about 65% by weight of tellurium.

The phase change material layer was obtained at a temperature of about 55% of about 580° C. (a melting point temperature of the source target). While forming the phase change material layer, a bias power of about 100 W to about 5 KW was applied to the source target in the sputtering process. A chamber for forming the phase change material layer had a process pressure of about 0.05 mTorr to about 10 mTorr. The phase change material layer had an overhang at an upper portion of the trench, and also defects such as voids were generated in the phase change material layer positioned in the trench.

Comparative Example 2

A trench having a line shape was formed on an object. The trench had a depth of about 1,200 Å, a lower width of about 300 Å and an upper width of about 700 Å. To form a phase change material layer filling the trench, a source target including boron, germanium, antimony and tellurium was used. The source target included about 5% to about 30% by weight of boron, about 15% to about 30% by weight of germanium, about 15% to about 30% by weight of antimony. Further, the source target included about 45% to about 65% by weight of tellurium.

The phase change material layer was obtained at a temperature of about 55% of about 590° C. (a melting point temperature of the source target). While forming the phase change material layer by a sputtering process, a bias power of about 100 W to about 5 KW was applied to the source target. A chamber for forming the phase change material layer had a process pressure of about 0.05 mTorr to about 10 mTorr. The phase change material layer had defects such as an overhang at an upper portion of the trench and voids in the trench.

Comparative Example 3

A trench having a line shape was formed on an object. The trench had a depth of about 1,200 Å, a lower width of about 300 Å and an upper width of about 700 Å. To form a phase change material layer filling the trench, a source target including nitrogen, germanium, antimony and tellurium was used in a sputtering process. The source target included about 5% to about 30% by weight of nitrogen, about 15% to about 30% by weight of germanium, about 15% to about 30% by weight of antimony. Additionally, the source target included about 45% to about 65% by weight of tellurium.

The phase change material layer was obtained at a temperature of about 55% of about 600° C. (a melting point temperature of the source target). While forming the phase change material layer by the sputtering process, a bias power of about 100 W to about 5 KW was applied to the source target. A chamber for forming the phase change material layer had a process pressure of about 0.05 mTorr to about 10 mTorr. The phase change material layer had defects such as an overhang at an upper portion of the trench and voids in the trench.

Comparative Example 4

A trench having a line shape was formed on an object. The trench had a depth of about 1,200 Å, a lower width of about 300 Å and an upper width of about 700 Å. To form a phase change material layer filling the trench, a source target including oxygen, germanium, antimony and tellurium was used in a sputtering process. The source target included about 5% to about 30% by weight of oxygen, about 15% to about 30% by weight of germanium, about 15% to about 30% by weight of antimony. Further, the source target included about 45% to about 65% by weight of tellurium.

The phase change material layer was obtained at a temperature of about 55% of about 610° C. (a melting point temperature of the source target). While forming the phase change material layer by the sputtering process, a bias power of about 100 W to about 5 KW was applied to the source target. A chamber for forming the phase change material layer had a process pressure of about 0.05 mTorr to about 10 mTorr. The phase change material layer had defects such as an overhang at an upper portion of the trench, and voids in the trench.

Comparative Example 5

A trench having a line shape was formed on an object. The trench had a depth of about 1,200 Å, a lower width of about 300 Å and an upper width of about 700 Å. To form a phase change material layer filling the trench, a source target including silicon, germanium, antimony and tellurium was used in a sputtering process. The source target included about 5% to about 30% by weight of silicon and about 15% to about 30% by weight of germanium. Further, the source target included about 15% to about 30% by weight of antimony and about 45% to about 65% by weight of tellurium.

The phase change material layer was obtained at a temperature of about 55% of about 620° C. (a melting point temperature of the source target). While forming the phase change material layer by the sputtering process, a bias power of about 100 W to about 5 KW was applied to the source target. A chamber for forming the phase change material layer had a process pressure of about 0.05 mTorr to about 10 mTorr. The phase change material layer had defects such as an overhang at an upper portion of the trench and voids in the trench.

Comparative Example 6

A trench having a line shape was formed on an object. The trench had a depth of about 1,200 Å, a lower width of about 300 Å and an upper width of about 700 Å. To form a phase change material layer filling the trench, a source target including carbon, germanium, antimony and tellurium was used. The source target included about 5% to about 30% by weight of carbon, about 15% to about 30% by weight of germanium, about 15% to about 30% by weight of antimony. Additionally, the source target included about 45% to about 65% by weight of tellurium.

The phase change material layer was obtained at a temperature of about 55% of about 605° C. (a melting point temperature of the source target). While forming the phase change material layer by a sputtering process, a bias power of about 100 W to about 5 KW was applied to the source target. A chamber for forming the phase change material layer had a process pressure of about 0.05 mTorr to about 10 mTorr. The phase change material layer had defects such as an overhang at an upper portion of the trench and voids in the trench.

Comparative Example 7

A trench having a line shape was formed on an object. The trench had a depth of about 1,200 Å, a lower width of about 300 Å and an upper width of about 700 Å. To form a phase change material layer filling the trench, a source target including iron, germanium, antimony and tellurium was used in a sputtering process. The source target included about 5% to about 30% by weight of iron and about 15% to about 30% by weight of germanium. Further, the source target included about 15% to about 30% by weight of antimony and about 45% to about 65% by weight of tellurium.

The phase change material layer was obtained at a temperature of about 55% of about 610° C. (a melting point temperature of the source target). While forming the phase change material layer by the sputtering process, a bias power of about 100 W to about 5 KW was applied to the source target. A chamber for forming the phase change material layer had a process pressure of about 0.05 mTorr to about 10 mTorr. The phase change material layer had defects such as an overhang at an upper portion of the trench, and voids or seams generated in the trench.

Comparative Example 8

A trench having a line shape was formed on an object. The trench had a depth of about 1,200 Å, a lower width of about 300 Å and an upper width of about 700 Å. To form a phase change material layer filling the trench, a source target including aluminum, germanium, antimony and tellurium was used in a sputtering process. The source target included about 5% to about 30% by weight of aluminum, about 15% to about 30% by weight of germanium, about 15% to about 30% by weight of antimony. Additionally, the source target included about 45% to about 65% by weight of tellurium.

The phase change material layer was obtained at a temperature of about 55% of about 610° C. (a melting point temperature of the source target). While forming the phase change material layer by the sputtering process, a bias power of about 100 W to about 5 KW was applied to the source target. A chamber for forming the phase change material layer had a process pressure of about 0.05 mTorr to about 10 mTorr. The phase change material layer had defects an overhang at an upper portion of the trench, and voids in the trench.

According to Comparative Examples 1 to 8, defects such as voids, seams and/or overhangs may be easily generated in the phase change material layers when the phase change material layers are formed at a relative low process temperature. However, when the phase change material layer are obtained at a relatively high temperature according to Examples 1 to 8, the phase change material layers may completely fill the trench without causing voids, seams and/or overhangs in the phase change material layers.

Figure 4:
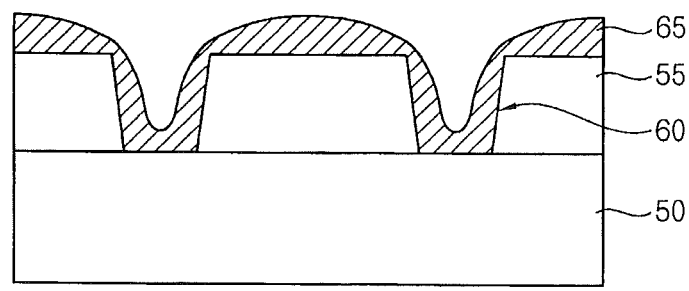
Figure 5:
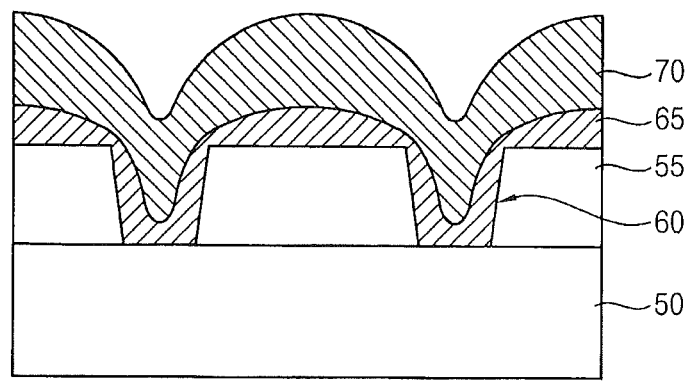
Figure 6:
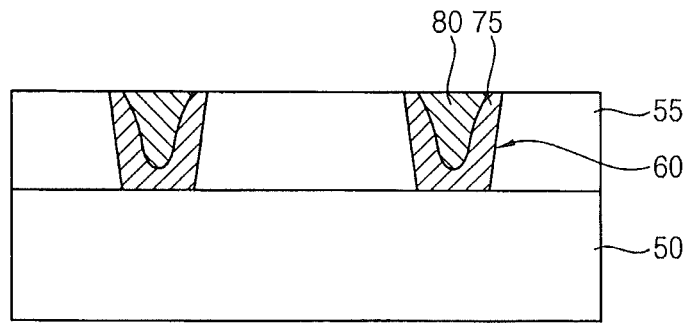

FIGS. 4 to 6 are cross sectional views illustrating a method of forming a phase change layer in accordance with example embodiments according to the inventive concept.

Referring to FIG. 4, after an insulation structure 55 is formed on an object 50, the insulation structure 55 is partially etched to provide a minute structure 60 through the insulation structure 55. The minute structure 60 may expose a portion of the object 50.

The object 50 may include various substrates such as a semiconductor substrate, a substrate having a semiconductor layer, an insulation substrate, a glass substrate, a metal oxide substrate, etc. Additionally, the object 50 may include various structures like a conductive pattern, an electrode, a pad, a contact, a contact region, etc., which are provided on the various substrates.

The insulation structure 55 may include an oxide, a nitride and/or an oxynitride. For example, the insulation structure 55 may include silicon oxide, silicon nitride, silicon oxynitride, titanium oxynitride, etc. These may be used alone or in a combination thereof. The insulation structure 55 may have a single layer structure including an oxide film, a nitride film or an oxynitride film. Alternatively, the insulation structure 55 may have a multi layer structure including an oxide film, a nitride film and/or an oxynitride film.

In example embodiments according to the inventive concept, the minute structure 60 may include a minute contact hole, a minute via hole, a minute opening, a minute trench, etc. Here, the minute structure 60 may have a relatively high aspect ratio. The minute structure 60 may expose at least a portion of the object 50. Further, the minute structure 60 may expose a contact region, a conductive pattern or a switching device provided on the object 50. The minute structure 60 may be obtained by a photolithography process or an etching process using an additional mask such as a hard mask.

Referring now to FIG. 4, a first phase change material layer 65 is formed on the insulation structure 55 to partially fill up the minute structure 60. The first phase change material layer 65 may be positioned on an exposed portion of the object 50, a sidewall of the minute structure 60 and the insulation layer 55. The first phase change material layer 65 may be formed using a first phase change material. The first phase change material may include the chalcogenide compound, the non-chalcogenide compound, the chalcogenide compound including the dopant, the non-chalcogenide compound including the dopant, etc.

In example embodiments according to the inventive concept, the first phase change material layer 65 may be obtained by a first PVD process that does not utilize the above-described in-situ reflow mechanism. In this case, the first PVD process for forming the first phase change material layer 65 may be performed at a relative low first temperature below about 60% of a melting point temperature of the first phase change material. For example, the first phase change material layer 65 may be formed on the object 50 and the insulation structure 55 by a first sputtering process carried out at the relatively low first temperature. The first phase change material layer 65 may have a thickness substantially the same as or substantially similar to about ⅓ of a depth of the minute structure 60. That is, the first phase change material layer 65 may partially fill the minute structure 60 by about ⅓ of the depth of the minute structure 60 based on the exposed object 50.

When the first phase change material layer 65 is formed by the first PVD process, ingredients in the first phase change material layer 65 may not vigorously occur at a surface of the first phase change material layer 65. Hence, the first phase change material layer 65 on the insulation structure 55 may have a rounded shape that has a radius of curvature substantially larger than that of a dome shape or a hemi-spherical shape. When a phase change memory device includes the first phase change material layer 65, the phase change material layer 65 may correspond to a programmable volume (PV) region because the first phase change material layer 65 may cause a phase transition therein by a current applied through a lower structure. That is, the first phase change material in the first phase change material layer 65 may easily cause a phase transition by the current when the current is applied to the first phase change material layer 65 through a lower contact, a lower pad, a lower electrode, etc.

According to example embodiments according to the inventive concept, the first phase change material layer 65 may be obtained by depositing the first phase change material on the object 50 and the insulation structure 55 at the relatively low first temperature in which the first phase change material may not cause in-situ reflow of the ingredients in the first phase change material. In this case, the first phase change material layer 65 may partially fill up the minute structure 60, so that defects such as voids or seams may not substantially occur in the first phase change material 65 in the minute structure 60.

Referring to FIG. 5, a second phase change material layer 70 is formed on the first phase change material layer 65. The second phase change material layer 70 may completely fill up the minute structure 60. The second phase change material layer 70 may be obtained at a relatively high second temperature by a second PVD process utilizing the above-described in-situ reflow mechanism. In example embodiments according to the inventive concept, the second phase change material layer 70 may be integrally formed with the first phase change material layer 65. The second phase change material layer 70 may be formed using a second phase change material. The second phase change material may include the chalcogenide compound, the non-chalcogenide compound, the chalcogenide compound having the dopant, the non-chalcogenide compound having the dopant, etc.

In example embodiments according to the inventive concept, the second phase change material in the second phase change material layer 70 may have a composition substantially similar to that of the first phase change material included in the first phase change material layer 65. In this case, a portion of the second phase change material layer 70 positioned in the minute structure 60 may have a composition slightly different from that of the first phase change material layer 65 in the minute structure 60. That is, a composition difference between the first and the second phase change materials may occur in the minute structure 60 because the first and the second phase change material layers 65 and 70 are formed at different temperatures, respectively. Therefore, at least one ingredient in the second phase change material layer 70 may have a content different from that of at least one ingredient in the first phase change material layer 65. In some example embodiments according to the inventive concept, a content of antimony (Sb) and/or tellurium (Te) in the second phase change material layer 70 may be substantially larger than a content of antimony and/or tellurium in the first phase change material layer 65. Thus, the second phase change material in the minute structure 60 may have a relatively rich content of antimony and/or tellurium.

According to example embodiments according to the inventive concept, the second PVD process may be carried out at the relatively high second temperature substantially greater than the first temperature. For example, the second phase change material layer 70 may be formed by a second sputtering process performed at the second temperature above about 60% of a melting point temperature of the second phase change material. The second phase change material layer 70 may have a thickness above about ⅔ of the depth of the minute structure 60. Therefore, a thickness ratio between the first phase change material layer 65 and the second phase change material 70 may be in a range between about 1.3 and about 3.0. For example, the second phase change material layer 70 may have a thickness of about 800 Å to about 1,200 Å when the first phase change material layer 65 has a thickness of about 400 Å to about 600 Å.

When the second phase change material layer 70 is obtained using the in-situ reflow mechanism according to example embodiments according to the inventive concept, the ingredients in the second phase change material may be vigorously diffused at a surface of the second phase change material layer 70 and a surface energy of the second phase change material may be reduced. Thus, voids or seams may be reduced in the second phase change material layer 70 located in the minute structure 60. Additionally, over hangs may also be reduced in the second phase change material layer 70 formed adjacent to an upper sidewall of the minute structure 60. Furthermore, the second phase change material layer 70 over the insulation structure 55 may have a substantially hemi-spherical shape, a substantially dome shape, a substantially oval spherical shape, etc. Hence, an upper portion of the second phase change material layer 70 may have a radius of curvature substantially smaller than that of an upper portion of the first phase change material layer 65.

When a phase change memory device includes the second phase change material layer 70 and the first phase change material layer 65, the second phase change material layer 70 may correspond to a non-programmable volume (NPV) region in which a phase transition does not occur. That is, the second phase change material layer 70 may not undergo a phase transition when a current is applied through the first phase change material layer 65 from the lower structure such as the lower contact, the lower pad, the lower electrode, etc. However, the first phase change material layer 65 may more readily undergo the phase transition in response to the applied current as described above. Since the phase change memory device includes the first and the second phase change material layers 65 and 70 corresponding to the PV and the NPV regions, the phase change memory device may have increased resistance margin between a set condition and a reset condition of the phase change memory device, and also the phase change memory device may ensure improved data retention characteristic because of the first and the second phase change material layer 65 and 70.

In case that a phase change material layer is formed to fill up a minute structure using the in-situ reflow mechanism, a composition of the phase change material layer may vary in the minute structure. For example, when the phase change material includes antimony and tellurium, contents of antimony and tellurium in a portion of the phase change material layer in the minute structure may be substantially larger than contents of antimony and tellurium in other portions of the phase change material layer located out of the minute structure. If the portion of the phase change material layer positioned in the minute structure includes relatively more antimony and tellurium, the phase change material may not ensure proper data retention characteristic because a phase transition of a phase change material may occur at the portion of the phase change material layer in the minute structure. According to example embodiments according to the inventive concept, the first phase change material layer 65 is formed at the relatively low first temperature in which in-situ reflow of the ingredients in the first phase change material layer may not occur, so that the first phase change material layer 65 may improve data retention characteristics. Additionally, the second phase change material layer 70 is obtained at the relatively high second temperature using the in-situ reflow mechanism, such that the second phase change material layer may reduce defects from generating in the minute structure. As a result, the phase memory device including the first and the second phase change material layers 65 and 70 may provide enhanced data retention characteristic, improved resistance margin, etc.

In some example embodiments according to the inventive concept, the first and the second phase change material layers 65 and 70 may be formed in-situ. That is, after forming the first phase change material layer 65 on the object 50 and the insulation structure 55, the second phase change material layer 70 may be successively formed on the first phase change material layer 65 by increasing a process temperature from the first temperature to the second temperature while maintaining a process pressure of a chamber without a vacuum break. For example, the first and the second phase change material layers 65 and 70 may be obtained in-situ by increasing a process temperature of a sputtering process without changing a composition of a source target.

Referring to FIG. 6, the first and the second phase change material layers 65 and 70 are partially removed until the insulation structure 55 is exposed. Thus, a phase change structure is formed to completely fill up the minute structure 60. The phase change structure includes a first phase change material layer pattern 75 and a second phase change material layer pattern 80 successively formed on the object 50. The first and the second phase change material layer patterns 75 and 80 may be formed by a CMP process and/or an etch-back process.

Figure 7:
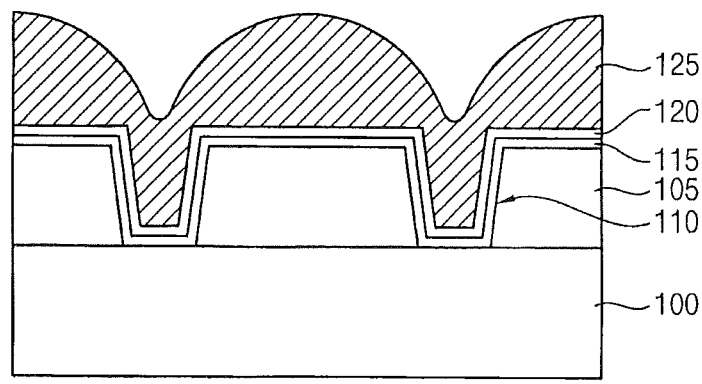
Figure 8:
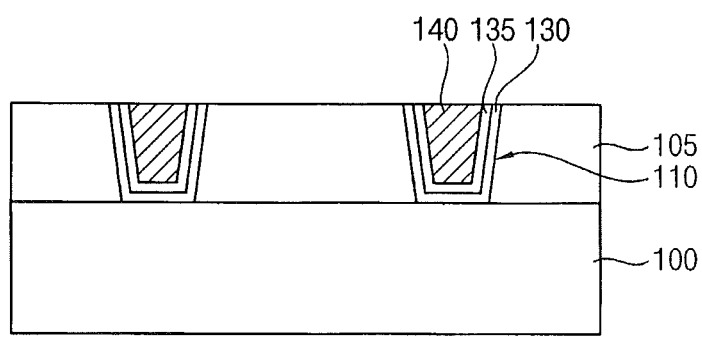

FIGS. 7 and 8 are cross sectional views illustrating a method of forming a phase change structure in accordance with example embodiments according to the inventive concept.

Referring to FIG. 7, an insulation structure 105 is formed on an object 100 including a substrate. The insulation structure 105 may include at least one of an oxide film, a nitride film and an oxynitride film. For example, the insulation structure 105 may include at least one of a silicon oxide film, a silicon nitride film and a silicon oxynitride film.

The insulation structure 105 is partially etched to provide a minute structure 110 that exposes a predetermined portion of the object 100. For example, the minute structure 110 may be formed by a photolithography process or an etching process using an additional mask.

A wetting layer 115 is formed on an exposed portion of the object 100, a sidewall of the minute structure 110 and the insulation structure 105. The wetting layer 115 may be uniformly formed along a profile of the minute structure 110. The wetting layer 115 may be formed an ALD process, a CVD process, a sputtering process, a PLD process, etc. The wetting layer 115 may have a relatively thin thickness. For example, the wetting layer 115 may have a thickness below about 200 Å.

In example embodiments according to the inventive concept, the wetting layer 115 may be formed using a material that improves a wettability of a phase change material layer 125 successively formed thereon. The wettability of the phase change material layer 125 may indicate a dispersion degree of the phase change material layer 125 relative to the wetting layer 115. In example embodiments according to the inventive concept, the wetting layer 115 may be formed using a metal and/or a metal nitride. For example, the wetting layer 115 may include titanium (Ti), titanium nitride (TiNx), tantalum (Ta), tantalum nitride (TaNx), tungsten (W), tungsten nitride (WNx), etc. These may be used alone or in a combination thereof. In some example embodiments according to the inventive concept, the wetting layer 115 may be formed using an insulation material such as a metal oxide. For example, the wetting layer 115 may include niobium oxide (NbOx), zirconium oxide (ZrOx), hafnium oxide (HfOx), etc. These may be used alone or in a combination thereof. When the wetting layer 115 includes the metal oxide, the wetting layer 115 may have a very thin thickness for ensuring tunneling of charges such as electrons from a contact region of the object 100 toward the phase change material layer 125.

A seed layer 120 is formed on the wetting layer 115. The seed layer 120 may be uniformly formed on the wetting layer 115. Namely, the seed layer 120 may be conformally formed on the wetting layer 115 along the profile of the minute structure 110. The seed layer 120 may be formed using a metal, a metal nitride, a metal silicide, a metal oxide, etc. For example, the seed layer 120 may include germanium (Ge), antimony (Sb), germanium-antimony-tellurium (Ge—Sb—Te), antimony-tellurium (Sb—Te), germanium-tellurium (Ge—Te), titanium (Ti), zirconium (Zr), hafnium (Hf), vanadium (V), niobium (Nb), tantalum (Ta), tungsten (W), titanium nitride (TiNx), zirconium nitride (ZrNx), hafnium nitride (HfNx), vanadium nitride (VNx), niobium nitride (NbNx), tantalum nitride (TaNx), tungsten nitride (WNx), cobalt silicide (CoSix), titanium silicide (TiSix), tantalum silicide (TaSix), nickel silicide (NiSix), germanium silicide (GeSix), titanium aluminum nitride (TiAlxNy), titanium carbon nitride (TiCxNy), tantalum carbon nitride (TaCxNy), titanium silicon nitride (TiSixNy), tantalum silicon nitride (TaSixNy), titanium oxide (TiOx), zirconium oxide (ZrOx), hafnium oxide (HfOx), niobium oxide (NbOx), tantalum oxide (TaOx), tungsten oxide (WOx), vanadium oxide (VOx), etc. These may be used alone or in a combination thereof.

In example embodiments according to the inventive concept, the seed layer 120 may be obtained by a CVD process, an ALD process, a sputtering process, a PLD process, etc. The seed layer 120 may also have a relatively thin thickness. For example, the seed layer 120 may have a thickness below about 400 Å.

In some example embodiments according to the inventive concept, one of the wetting layer 115 and the seed layer 120 may be formed on the object 100 and the insulation layer 105. For example, the wetting layer 115 may be formed only on the object 100 and the insulation layer 105, or the seed layer 120 may be provided only on the object 100 and the insulation layer 105.

Referring now to FIG. 7, the phase change material layer 125 is formed on the seed layer 120. The phase change material layer 125 may be obtained utilizing the in-situ reflow mechanism. For example, the phase change material 125 may be formed on the seed layer 120 by a process substantially the same as or substantially similar to the process described with reference FIG. 2. The phase change material layer 125 may be formed using a phase change material that includes the chalcogenide compound, the non-chalcogenide compound, the chalcogenide compound having the dopant, the non-chalcogenide compound having the dopant, etc.

Referring to FIG. 8, portions of the phase change material layer 125, the seed layer 120 and the wetting layer 115 are removed until the insulation structure 105 is exposed. Hence, a phase change structure is provided in the minute structure 110. The phase change structure may be obtained by a CMP process and/or an etch-back process.

In example embodiments according to the inventive concept, the phase change structure includes a wetting layer pattern 130, a seed layer pattern 135 and a phase change material layer pattern 140. The wetting layer pattern 130 may be positioned on the exposed object 110 and the sidewall of the minute structure 110. The seed layer pattern 135 is formed on the wetting layer pattern 130. The wetting layer pattern 130 and the seed layer pattern 135 may partially fill the minute structure 110. The phase change material layer pattern 140 is located on the seed layer pattern 135 to fully fill up the minute structure 110.

In some example embodiments according to the inventive concept, the phase change structure may include the phase change material layer pattern 140 and one of the wetting layer pattern 130 and the seed layer pattern 135. For example, the phase change structure may have the wetting layer pattern 130 and the phase change material layer pattern 140. Alternatively, the phase change structure may include the seed layer pattern 135 and the phase change material layer pattern 140. Here, the seed layer pattern 135 may be located on the object 100 and the sidewall of the minute structure 110.

In some example embodiments according to the inventive concept, the phase change structure may include a first phase change material layer pattern and a second phase change material layer pattern. In this case, the first and the second phase change material layer patterns may be obtained by processes substantially the same as or substantially similar to those described with reference to FIGS. 4 to 6.

In some example embodiments according to the inventive concept, the phase change structure may include a first phase change material layer pattern, a second phase change material layer pattern, and at least one of the wetting layer pattern 130 and the seed layer pattern 135. For example, the phase change structure may have the first phase change material layer pattern, the second phase change material layer pattern, and the wetting layer pattern 130. Alternatively, the phase change structure may include the first phase change material layer pattern, the second phase change material layer pattern, and the seed layer pattern 135.

FIGS. 9 to 13 are cross sectional views illustrating a method of manufacturing a phase memory device in accordance with example embodiments according to the inventive concept. The phase change memory device obtained by the method described with reference to FIGS. 9 to 13 may include a phase change material layer pattern substantially the same as or substantially similar to the phase change material layer pattern described with reference to FIG. 3. Alternatively, the phase change memory device manufactured by the method described with reference to FIGS. 9 to 13 may have a phase change structure having a construction substantially the same as or substantially similar to that of the phase change structure described with reference to FIG. 8.

Figure 9:
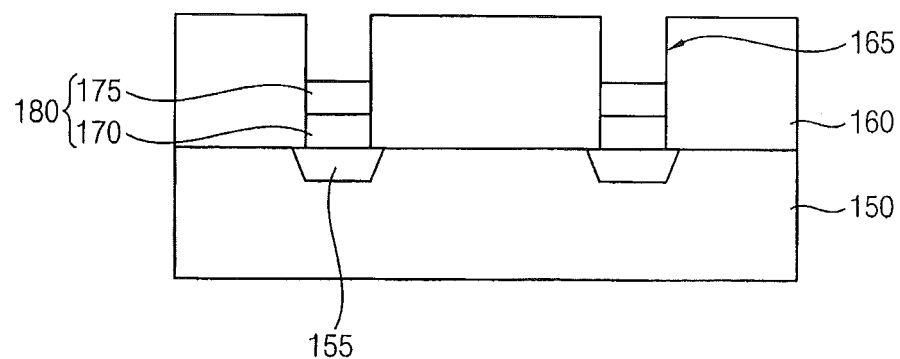

Referring to FIG. 9, a contact region 155 is formed at a predetermined portion of a substrate 150. The substrate 150 may include a semiconductor substrate, a substrate having a semiconductor layer, a metal oxide substrate, etc. The contact region 155 may include an impurity region, a diffusion region, a conductive region, etc. For example, the contact region 155 may be formed on the substrate 150 by doping impurities into the predetermined portion of the substrate 150 through an ion implantation process.

In example embodiments according to the inventive concept, a lower structure may be provided on the substrate 150. The lower structure may include a conductive pattern, a pad, a contact, an insulation pattern, a switching device, etc. Here, the contact region 155 may be electrically connected to the switching device of the lower structure.

A first insulation layer 160 is formed on the substrate 150 having the contact region 155. The first insulation layer 160 may be formed using an oxide. For example, the first insulation layer 160 may be formed using silicon oxide such as USG, SOG, BPSG, TOSZ®, FOX, TEOS, PE-TEOS, HDP-CVD oxide, etc. These may be used alone or in a mixture thereof. Further, the first insulation layer 160 may be formed by a CVD process, an LPCVD process, a spin coating process, a PECVD process, an HDP-CVD process, etc. When the lower structure is disposed on the substrate 150, the first insulation layer 160 may have a sufficient thickness to fully cover the lower structure.

A first opening 165 is formed through the first insulation layer 160 by partially etching the first insulation layer 160. The first opening 165 exposes the contact region 155. For example, the first opening 165 may be formed by a photolithography process. The first opening 165 may exposes at least a portion of the contact region 155. In example embodiments according to the inventive concept, the first opening 165 may have a sidewall substantially perpendicular to the substrate 150. Alternatively, the sidewall of the first opening 165 may be inclined relative to the substrate 150 by a predetermined angle.

Referring now to FIG. 9, a diode 180 is formed on the contact region 155 exposed by the first opening 165. The diode 180 includes a first conductive layer 170 and a second conductive layer 175 sequentially formed on the contact region 155. The diode 180 may partially fill the first opening 165. The diode 180 may be formed using polysilicon layers including different impurities, respectively. For example, the first conductive layer 170 may include P type impurities when the second conductive layer 175 includes N type impurities. Alternatively, the first conductive layer 170 may include N type impurities when the second conductive layer 175 includes P type impurities. However, conductive types of the impurities in the first and the second conductive layers 170 and 175 may vary in accordance with a conductive type of the contact region 155.

In a process for forming the diode 180 according to example embodiments according to the inventive concept, a lower conductive layer (not illustrated) may be formed on the contact region 155 using the contact region 150 as a seed, and then different impurities may be doped into an upper portion and a lower portion of the lower conductive layer, thereby forming the first and the second conductive layers 170 and 175. Here, the lower conductive layer may partially fill up the first opening 165. For example, the lower conductive layer may be obtained by a selective epitaxial growth (SEG) process. When the lower conductive layer is formed from the contact region 155, the lower conductive layer may include silicon. In some example embodiments according to the inventive concept, a polysilicon layer (not illustrated) having different impurities may be formed on the contact region 155 in the first opening 165, and then the polysilicon layer may be partially removed to form the first and the second conductive layers 170 and 175.

Figure 10:
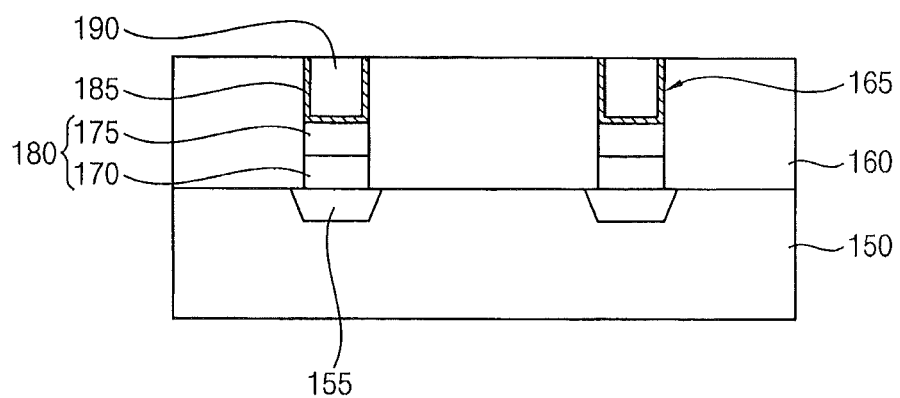

Referring to FIG. 10, a lower electrode layer (not illustrated) is formed on the diode 180, the sidewall of the first opening 165 and the first insulation layer 160. The lower electrode layer may be uniformly formed along a profile of the first opening 165. Hence, the first opening 165 may not be completely filled with the lower electrode layer. In example embodiments according to the inventive concept, the lower electrode layer may be formed using silicon, a metal and/or a metal compound. For example, the lower electrode layer may include polysilicon containing impurities, amorphous silicon containing impurities, single crystalline silicon containing impurities, titanium, tungsten, tantalum, aluminum, titanium nitride, tungsten nitride, tantalum nitride, aluminum nitride, titanium aluminum nitride, etc. These may be used alone or in a combination thereof. The lower electrode layer may be obtained by a CVD process, a PECVD process, an ALD process, a PLD process, a sputtering process, etc.

A filling layer (not illustrated) is formed on the lower electrode layer. The filling layer may sufficiently fill up the first opening 165. The filling layer may be formed using an oxide, a nitride, an oxynitride, etc. For example, the filling layer may include silicon oxide, silicon nitride, silicon oxynitride, titanium oxynitride, etc. The filling layer may be obtained by a CVD process, an LPCVD process, a spin coating process, an ALD process, an HDP-CVD process, etc.

In some example embodiments according to the inventive concept, the lower electrode layer may completely fill the first opening 165. In this case, the filling layer may not be formed on the lower electrode layer.

The filling layer and the lower electrode layer are partially removed until the first insulation layer 160 is exposed, so that a lower electrode 185 and a filling member 190 are provided in the first opening 165. The lower electrode 185 and the filling member 190 may be formed by a CMP process, an etch-back process, etc. The lower electrode 185 may contact the sidewall of the first opening 165 and an upper face of the diode 180. The lower electrode 185 may fill up a peripheral portion of the first opening 165. The filling member 190 may completely fill the first opening 165. Here, the filling member 190 may enclose the lower electrode 185.

In example embodiments according to the inventive concept, the filling member 190 and the lower electrode 185 may have structures substantially confined by a shape of the first opening 165. For example, the lower electrode 185 may have a cylindrical structure having a substantially circular cross section, a substantially elliptical cross section or a substantially polygonal cross section when the first opening 165 has a substantially circular cross section, a substantially elliptical cross section or a substantially polygonal cross section. In this case, the filling member 190 may have a circular pillar structure, a substantially elliptical pillar structure or a substantially polygonal pillar structure.

In some example embodiments according to the inventive concept, the lower electrode 185 may have a structure substantially the same as or substantially similar to a shape of the first opening 165 when the filling member 190 is not provided in the first opening 165. For example, the lower electrode 185 may have various structures such as a substantially circular pillar shape, a substantially elliptical pillar shape or a substantially polygonal pillar shape when the first opening 165 has a substantially circular cross section, a substantially elliptical cross section or a substantially polygonal cross section.

Figure 11:
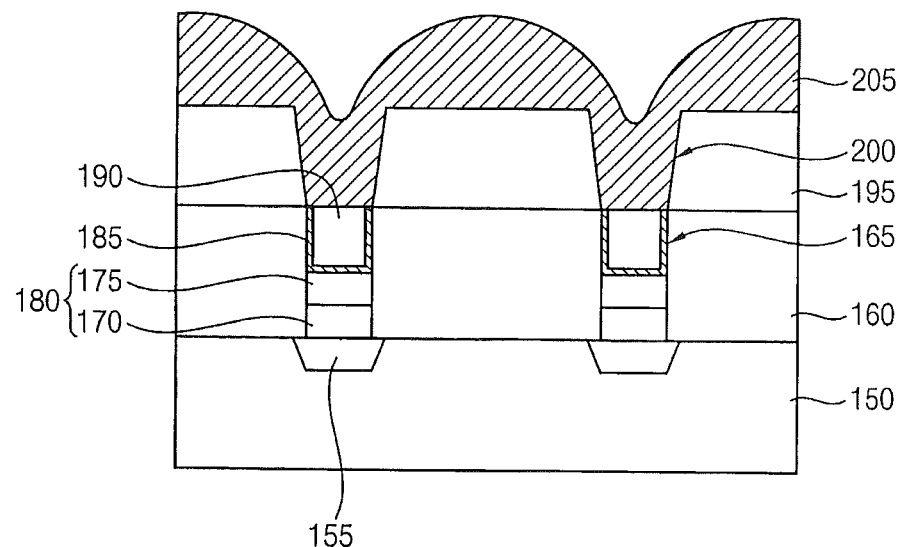

Referring to FIG. 11, an insulation structure 195 is formed on the first insulation layer 160, the lower electrode 185 and the filling member 190. The insulation structure 195 may be formed using an oxide, a nitride and/or an oxynitride. In example embodiments according to the inventive concept, the insulation structure 195 may have a single layer structure including an oxide film, a nitride film or an oxynitride film. Alternatively, the insulation structure 195 may have a multi layer structure that includes at least one of an oxide film, a nitride film and an oxynitride film. The insulation structure 195 may be obtained by a process substantially the same as or substantially similar to that described with reference to FIG. 1.

The insulation structure 195 is partially etched to form a minute structure 200 through the insulation structure 195. The minute structure 200 exposes the lower electrode 185 and the filling member 190. The minute structure 200 may have various shapes such as a hole having a substantially circular cross section, a hole having a substantially elliptical cross section, a hole having substantially polygonal cross section, etc. The minute structure 200 may be obtained through the insulation structure 195 by a photolithography process or an etching process using an additional mask. The minute structure 200 may be formed by a process substantially the same as or substantially similar to the process described with reference to FIG. 1. Further, the minute structure 200 may have a construction substantially the same as or substantially similar to that of the minute structure described with reference to FIG. 1.

As illustrated in FIG. 11, a phase change material layer 205 is formed on the insulation structure 195 to fill the minute structure 200. The phase change material layer 205 may be obtained by a PVD process utilizing the in-situ reflow mechanism. The phase change material layer 205 may be formed by a process substantially the same as or substantially similar to the process described with reference to FIG. 2. Additionally, the phase change material layer 205 may be formed using a phase change material substantially the same as or substantially similar to the phase change material described with reference to FIG. 2. Thus, the phase change material layer 205 may completely fill the minute structure 200 while allowing a reduction in defects such as a void, a seam or an overhang in the phase change material layer 205. Further, a portion of the phase change material layer 205 may be protruded over the insulation structure 195 to have a substantially dome shape, a substantially hemi-spherical shape, a substantially oval spherical shape, etc.

In some example embodiments according to the inventive concept, at least one of a wetting layer and a seed layer may be formed on a bottom and a sidewall of the minute structure 200 before forming the phase change material layer 205. The wetting layer and the seed layer may be formed by processes substantially the same as or substantially similar to the processes described with reference to FIG. 7.

Figure 12:
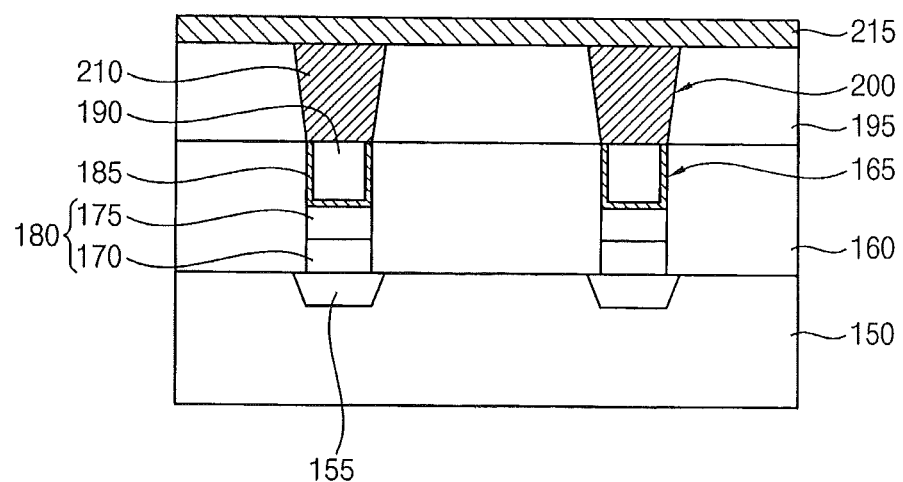

Referring to FIG. 12, the phase change material layer 205 is partially removed until the insulation structure 195 is exposed. Hence, a phase change material layer pattern 210 is formed in the minute structure 200. The phase change material layer pattern 210 may make contact with the lower electrode 185 and the filling member 190. For example, a lower peripheral portion of the phase change material layer pattern 210 may contact the lower electrode 185, and a lower central portion of the phase change material layer pattern 210 may make contact with the filling member 190. The phase change material layer pattern 210 may be obtained by a CMP process, an etch-back process, etc.

An upper electrode layer 215 is formed on the phase change material layer pattern 210 and the insulation structure 195. The upper electrode layer 215 may be formed using polysilicon, a metal, a metal nitride, a metal silicide, etc. For example, the upper electrode layer 215 may include polysilicon doped with impurities, titanium, tantalum, aluminum, tungsten, titanium nitride, titanium aluminum nitride, aluminum nitride, tungsten nitride, titanium silicide, cobalt silicide, tantalum silicide, nickel silicide, etc. These may be used alone or in a mixture thereof. The upper electrode layer 215 may be obtained by a CVD process, an ALD process, a PLD process, an evaporation process, a sputtering process, etc.

Figure 13:
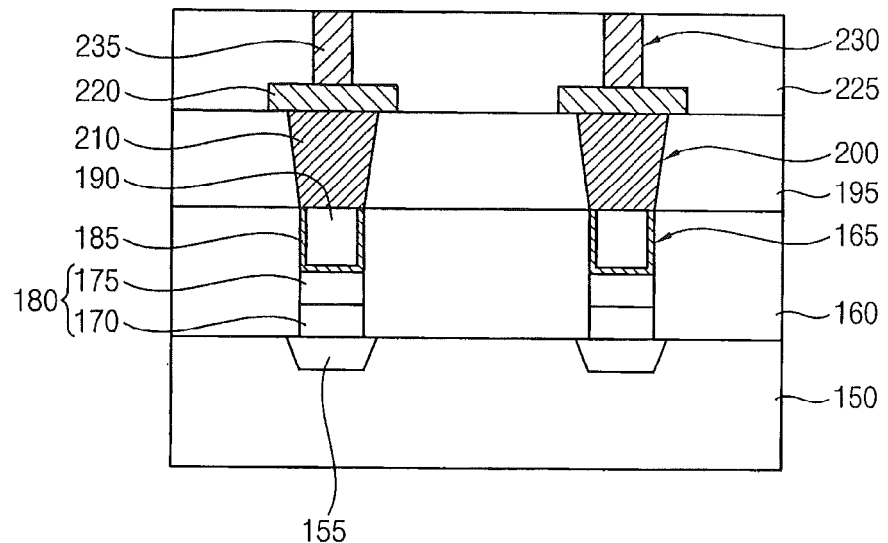

Referring to FIG. 13, an upper electrode 220 is formed on the phase change material layer pattern 210 by patterning the upper electrode layer 215. The upper electrode 220 may have a width substantially larger than that of the phase change material layer pattern 210. Thus, the upper electrode 220 may be located on the phase change material layer pattern 210 and a portion of the insulation structure 195 adjacent to the phase change material layer pattern 210.

A second insulation layer 225 is formed on the insulation structure 195 to cover the upper electrode 220. The second insulation layer 225 may be formed using an oxide, a nitride and/or an oxynitride. The second insulation layer 225 may be obtained by a CVD process, a spin coating process, a PECVD process, an HDP-CVD process, etc. In example embodiments according to the inventive concept, the second insulation layer 225 may include a material substantially the same as or substantially similar to that of the first insulation layer 160. Alternatively, the first and the second insulation layers 160 and 225 may be formed using different materials, respectively.

The second insulation layer 225 is partially etched to form a second opening 230 that exposes the upper electrode 220. The second opening 230 may expose a portion of the upper electrode 220 through the second insulation layer 225. The second opening 230 may be obtained by a photolithography process.

A conductive layer (not illustrated) is formed on the second insulation layer 225 to fill up the second opening 230. The conductive layer is partially removed until the second insulation layer 225 is exposed, such that a pad or a contact 235 is formed in the second opening 230. The contact 235 may contact the upper electrode 220. The conductive layer may be formed using a metal, a metal compound, polysilicon, etc. For example, the conductive layer may include polysilicon having impurities, titanium, aluminum, tantalum, tungsten, tungsten nitride, titanium aluminum nitride, aluminum nitride, tungsten nitride, etc. These may be used alone or in a combination thereof. Further, the conductive layer may be formed by a CVD process, an ALD process, a PLD process, an evaporation process, a sputtering process, etc. The contact 235 may be obtained by a CMP process and/or an etch-back process.

According to example embodiments according to the inventive concept, a phase change memory device may have a phase change material layer pattern completely filling a minute structure without any defect such as a void, a seam or an overhang. Therefore, the phase change memory device may ensure a sufficient resistance margin between a set state and a reset state.

Figure 14:
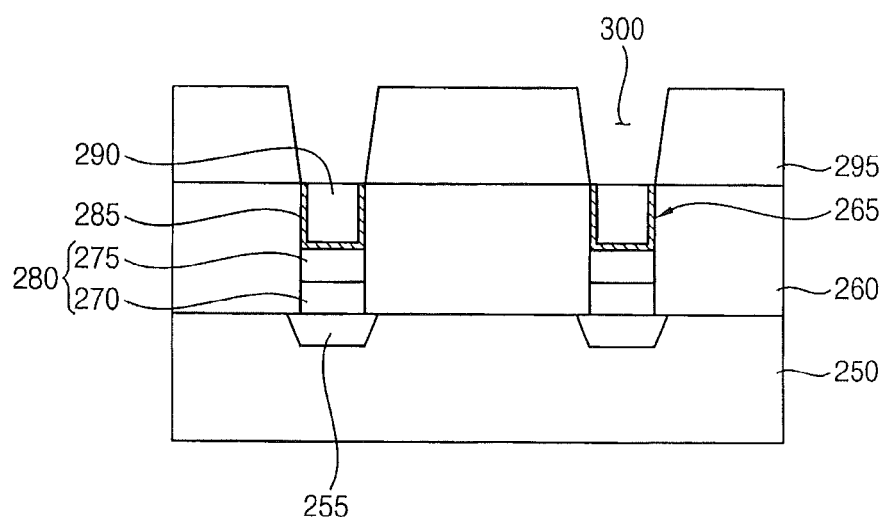
Figure 15:
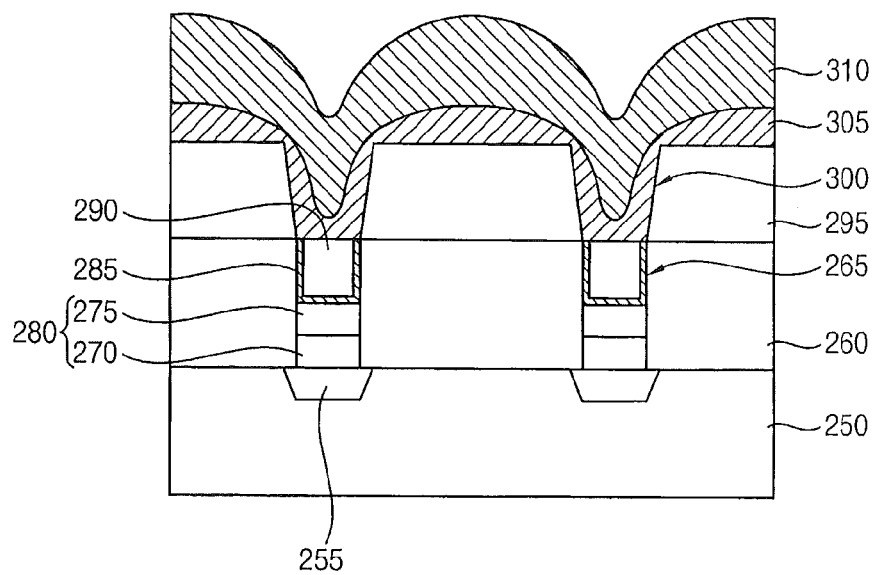
Figure 16:
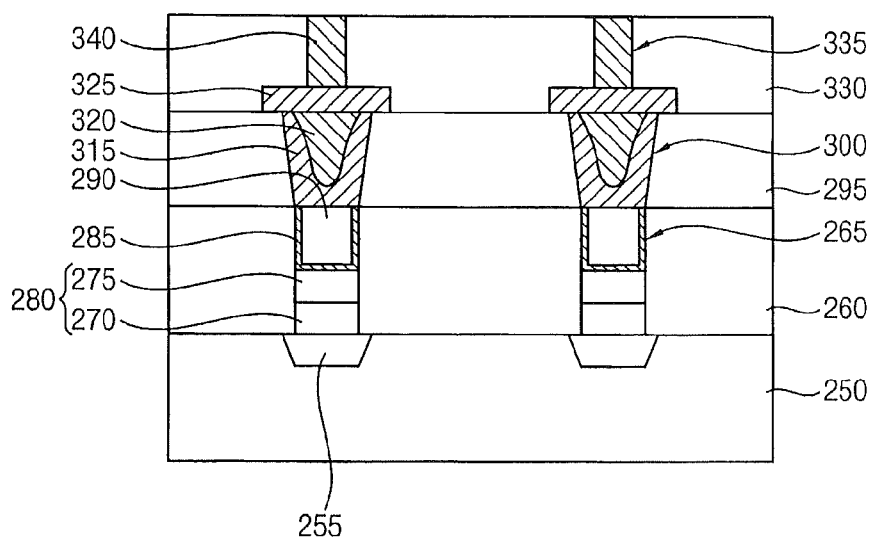

FIGS. 14 to 16 are cross sectional views illustrating a method of manufacturing a phase memory device in accordance with example embodiments according to the inventive concept. In the method illustrated in FIGS. 14 to 16, the phase change memory device may include phase change material layer patterns substantially the same as or substantially similar to those described with reference to FIG. 6. Further, the phase change memory device obtained the method illustrated in FIGS. 14 to 16 may include at least one of a wetting layer pattern and a seed layer pattern substantially the same as or substantially similar to the wetting layer pattern and the seed layer pattern described with reference to FIG. 8.

Referring to FIG. 14, a first insulation layer 260 is formed on a substrate 250 having a contact region 255. The contact region 255 may include an impurity region, a diffusion region, a conductive region, etc. A lower structure may be provided on the substrate 250. The lower structure may include a conductive pattern, a pad, a contact, an insulation pattern, a switching device, etc.

The first insulation layer 260 may be formed using an oxide by a CVD process, an LPCVD process, a PECVD process, a spin coating process, an HDP-CVD process, etc. In example embodiments according to the inventive concept, the first insulation layer 260 may have a level surface by a planarization process. For example, the first insulation layer 260 may have a flat upper face by a CMP process and/or an etch-back process.

A portion of the first insulation layer 260 is etched to form a first opening 265 through the first insulation layer 260. The first opening 265 may expose at least a portion of the contact region 255. In example embodiments according to the inventive concept, the first opening 265 may have a sidewall substantially perpendicular to the substrate 250, or substantially inclined relative to the substrate 250 by a predetermined angle.

A diode 280 is formed on the contact region 250 exposed through the first opening 265. The diode 280 includes a first conductive layer 270 and a second conductive layer 275. The diode 280 may partially fill the first opening 265. The diode 280 including the first and the second conductive layers 270 and 275 may be obtained by a process substantially the same as or substantially similar to the process described with reference to FIG. 9.

A lower electrode layer (not illustrated) is formed on the diode 280, the sidewall of the first opening 265 and the first insulation layer 260. The lower electrode layer may partially fill up the first opening 265. The lower electrode layer may be formed using polysilicon doped with impurities, a metal and/or a metal compound by a CVD process, a PECVD process, an ALD process, a PLD process, a sputtering process, etc.

A filling layer (not illustrated) is formed on the lower electrode layer to fully fill up the first opening 265. The filling layer may be formed using an oxide, a nitride and/or an oxynitride by a CVD process, an LPCVD process, a PECVD process, a spin coating process, an ALD process, an HDP-CVD process, etc. In example embodiments according to the inventive concept, the filling layer may not be provided on the lower electrode layer when the lower electrode layer completely fills the first opening 265.

The filling layer and the lower electrode layer are partially removed until the first insulation layer 260 is exposed to form a lower electrode 285 and a filling member 290 in the first opening 265. The lower electrode 285 may contact the diode 280 and the sidewall of the first opening 265. The filling member 290 may completely fill the first opening 265. The filling member 290 may be enclosed by the lower electrode 285. Each of the lower electrode 285 and the filling member 290 may have a structure defined by a shape of the first opening 265.

Referring now to FIG. 14, an insulation structure 295 is formed on the first insulation layer 260, the lower electrode 285 and the filling member 290. The insulation structure 295 may have a single layer structure that includes an oxide film, a nitride film or an oxynitride film. Alternatively, the insulation structure 295 may have a multi layer structure including at least two of an oxide film, a nitride film and an oxynitride film.

A minute structure 300 is formed through the insulation structure 295 by partially etching the insulation structure 295. The minute structure 300 may expose the filling member 290 and the lower electrode 285. The minute structure 300 may have various shapes having a substantially circular cross section, a substantially elliptical cross section, a substantially polygonal cross section, etc.

Referring to FIG. 15, a first phase change material layer 305 is formed on the insulation structure 295. The first phase change material layer 305 may partially fill the minute structure 300. The first phase change material layer 305 may be obtained at a relatively low first temperature by a first PVD process without the in-situ reflow mechanism. The first phase change material layer 305 may be formed by a process substantially the same as or substantially similar to the process described with reference to FIG. 5. Further, the first phase change material layer 305 may include a first phase change material substantially the same as or substantially similar to that of the first phase change material layer described with reference to FIG. 5. The first phase change material layer 305 may have a thickness below about ⅓ of a depth of the minute structure 300.

In some example embodiments according to the inventive concept, a wetting layer and/or a seed layer may be additionally formed on a bottom and the sidewall of the minute structure 300 before forming the first phase change material layer 305. Here, the wetting layer and the seed layer may be formed by processes substantially the same as or substantially similar to the processes described with reference to FIG. 7.

A second phase change material layer 310 is formed on the first phase change material layer 305 to fully fill the minute structure 300. The second phase change material layer 310 may be obtained at a relatively high second temperature by a second PVD process utilizing the in-situ reflow mechanism.

The second phase change material layer 310 may be formed on the first phase change material layer 305 by a process substantially the same as or substantially similar to the process described with reference to FIG. 5. Further, the second phase change material layer 310 may include a second phase change material substantially the same as or substantially similar to the second material in the second phase change material layer illustrated in FIG. 5. The second phase change material layer 310 may have a thickness above about ⅔ of the depth of the minute structure 300. Thus, a thickness ratio between the first and the second phase change material layers 305 and 310 may be about 1.0:about 1.3 to about 3.0.

In some example embodiments according to the inventive concept, the first and the second phase change material layers 305 and 310 may be obtained in-situ by a PVD process while increasing a process temperature of the PVD process. Thus, the first phase change material layer 350 may be integrally formed with the second phase change material layer 310.

Referring to FIG. 16, the second and the first phase change material layers 310 and 305 are partially removed until the insulation structure 295 is exposed. Hence, a phase change structure is provided in the minute structure 300. The phase change structure includes a first phase change material layer pattern 315 and a second phase change material layer pattern 320. The first and the second phase change material layer patterns 315 and 320 may be formed by a CMP process, an etch-back process, etc. The first phase change material layer pattern 315 may partially fill the minute structure 300, and the second phase change material layer pattern 310 may completely fill up the minute structure 300. In this case, the first phase change material layer pattern 315 may make contact with the lower electrode 285 and the filling member 290.

When a phase change memory device includes the first and the second phase change material layer patterns 315 and 320, the first and the second phase change material layer patterns 315 and 320 may correspond to a PV region and an NPV region, respectively. That is, a phase transition of the first phase change material may occur in the first phase change material layer pattern 315 whereas a phase transition of the second phase change material may not occur in the second phase change material layer pattern 320. Thus, the first phase change material layer 315 may easily cause the phase transition by a current applied from the lower electrode 285. However, the second phase change material layer 320 may not substantially cause the phase transition when the current is applied to the second phase change material layer pattern 320 through the lower electrode 285. Since the phase memory device includes the first and the second phase change material layer patterns 315 and 320, the phase change memory device may increase resistance margin between a set state and a reset state thereof. Further, the phase change memory device may have enhanced data retention characteristic when the phase change memory device includes the first and the second phase change material layer patterns 315 and 320 corresponding to the PV and the NPV regions.

As illustrated in FIG. 16, an upper electrode layer (not illustrated) is formed on the phase change structure and the insulation structure 295, and then the upper electrode layer is patterned to form an upper electrode 325 on the second phase change material layer pattern 320 and the insulation structure 295. The upper electrode 325 may have a size substantially larger than that of the second phase change material layer pattern 320. The upper electrode 325 may include polysilicon, a metal, a metal nitride and/or a metal silicide. The upper electrode layer may be formed by a CVD process, an ALD process, a PLD process, a vacuum evaporation process, a sputtering process, etc.

A second insulation layer 330 is formed on the insulation structure 295 to cover the upper electrode 325. The second insulation layer 330 may be formed using an oxide, a nitride and/or an oxynitride by a CVD process, a spin coating process, a PECVD process, an HDP-CVD process, etc.

A portion of the second insulation layer 330 is etched to form a second opening 335 that exposes the upper electrode 325. The second opening 335 may partially expose the upper electrode 325. A pad or a contact 340 is formed on the upper electrode 325 to fill up the second opening 335. The pas or the contact 340 may be formed using a metal, a metal compound and/or polysilicon. As a result, the phase change memory device having improved data retention characteristic and resistance margin may be provided on the substrate 250.

According to example embodiments according to the inventive concept, a phase change material layer pattern or a phase change structure may fill up a minute structure such as a minute hole, a minute opening or a minute trench by a physical vapor deposition process that utilizes in-situ reflow mechanism without generating defect in the phase change material layer pattern or the phase change structure. When a phase change memory device includes the phase change material layer pattern or the phase change structure, the phase change memory device may have improved response speed and reliability by increasing data retention characteristic and resistance margin between a set state and a reset state of the phase change memory device.

Figure 17:
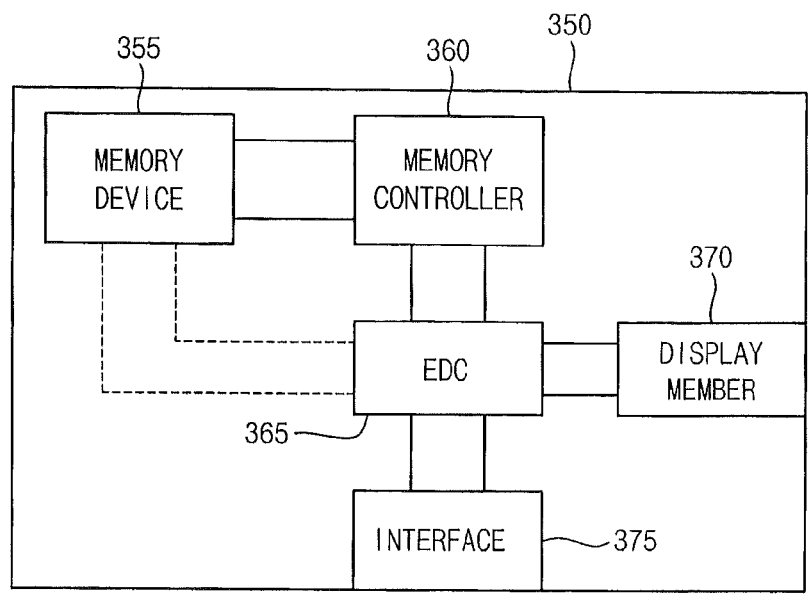

FIG. 17 is a block diagram illustrating a memory system in accordance with example embodiments according to the inventive concept.

Referring to FIG. 17, a memory system 350 may include a portable electronic device. For example, the memory system 350 may include a portable media player (PMP), a wireless communication device, an MP3 player, an electronic dictionary, etc. The memory system 350 may have a semiconductor memory device 355, a memory controller 360, an encoder/decoder (EDC) 365, a display member 370 and an interface 375. The memory device 355 may include a phase change memory device having various phase change structures or phase change material layers (patterns) as described above. Therefore, the memory device 355 may ensure enhanced data retention characteristic and improved reliability.

The EDC 365 may store data such as audio data and/or video dada into the memory device 355 through the memory controller 360. Additionally, the data may be outputted from the memory device 355 by the ECD 365 through the memory controller 360. Alternatively, the data may be directly stored into the memory device 355 from the ECD 365, and the data may be directly outputted from the memory device 355 into the ECD 365.

The EDC 365 may encode data to be stored in the memory device 355. For example, the EDC 365 may execute encoding for storing audio data and/or video data into the memory device 355 of a PMP or an MP3 player. Further, the EDC 365 may execute MPEG encoding for storing video data in the memory device 355. The EDC 365 may include multiple encoders to encode different types of data depending on their formats. For example, the EDC 365 may include an MP3 encoder for encoding audio data and an MPEG encoder for encoding video data.

The EDC 365 may also decode data outputted from the memory device 355. For example, the EDC 365 may decode MP3 audio data from the memory device 355. Further, the EDC 365 may decode MPEG video data from the memory device 355. The EDC 365 may include multiple decoders to decode different types of data depending on their formats. For example, the EDC 365 may include an MP3 decoder for audio data and an MPEG decoder for video data.

The EDC 365 may include an MP3 decoder for the audio data and an MPEG decoder for the video data. Alternatively, the EDC 365 may include a decoder for the audio data and/or the video data only. For example, encoded audio/video data may be inputted to the EDC 365, and then the EDC 365 may decode the inputted data and transfer the decoded data to the memory controller 360 an/or the memory device 355.

The EDC 365 may receive the encoded audio/video data or audio/video data being encoded via the interface 375. The interface 375 may be compliant with standard input devices, e.g. Fire Wire or USB. That is, the interface 375 may include a Fire Wire interface, a USB interface or the like. Data may be outputted from the memory device 355 by way of the interface 375.

The display member 370 may display to an end-user data outputted from the memory device 355 and decoded by the EDC 365. For example, the display member 370 may be an audio speaker or a display screen.

The memory device 355 according to example embodiments according to the inventive concept may have high response speed and enhanced reliability because the memory device 355 includes the above-described phase change memory device. Therefore, the memory system 350 including the memory device 355 may also ensure improved performance and enhanced reliability.

Figure 18:
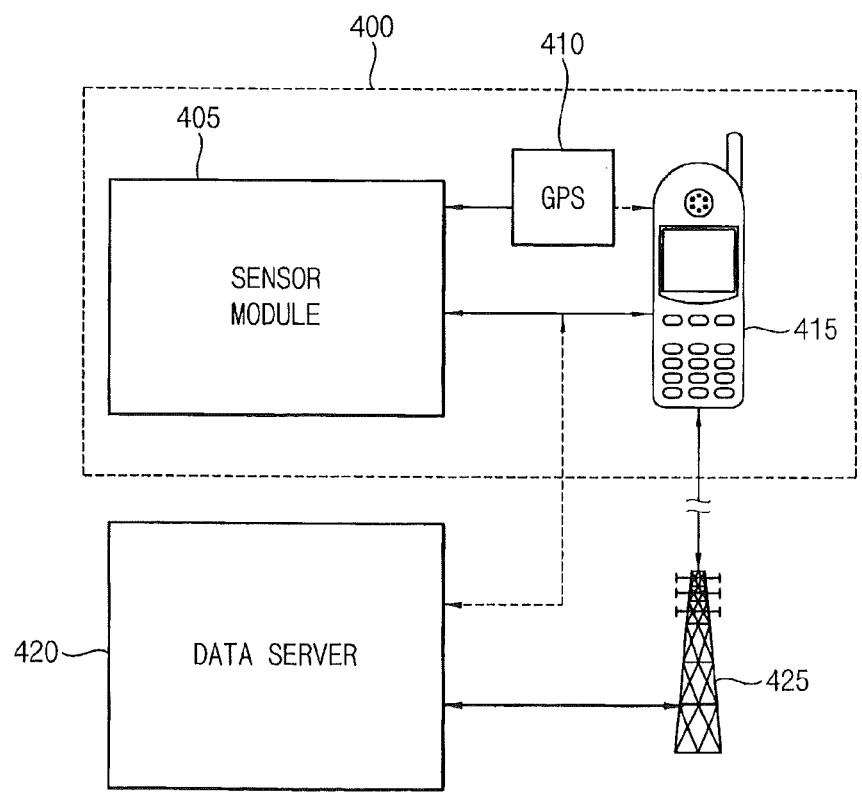

FIG. 18 is a block diagram illustrating a broadband communication system in accordance with example embodiments according to the inventive concept.

Referring to FIG. 18, a broadband communication system 400 includes a sensor module 405, a global positioning system (GPS) 410 and a mobile communication device 415. The broadband communication system 400 may communicate with a data server 420 and a base station 425. The mobile communication device 415 may send and receive a number of data, so that the mobile communication device 415 may have rapid processing speed and high reliability for the data. In example embodiments according to the inventive concept, the mobile communication device 415 may include a memory device that includes the above-described various phase change material layer patterns and/or phase change structures. Therefore, the mobile communication device 415 may have rapid processing speed with a relatively low driving voltage and may ensure high reliability for sending and receiving the data. Further, the above-described phase change memory device may be widely employed in various electric and electronic apparatuses. For example, the phase change memory device may be used in USB memories, MP3 players, digital cameras, memory cards, etc.

The foregoing is illustrative of example embodiments according to the inventive concept and is not to be construed as limiting thereof. Although a few example embodiments according to the inventive concept have been described, those skilled in the art will readily appreciate that many modifications are possible in the example embodiments according to the inventive concept without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments according to the inventive concept and is not to be construed as limited to the specific example embodiments according to the inventive concept disclosed, and that modifications to the disclosed example embodiments according to the inventive concept, as well as other example embodiments according to the inventive concept, are intended to be included within the scope of the appended claims.

What is claimed is:

1. A method of forming a phase change material layer, comprising:
   forming an insulation structure on an object;
   forming a high aspect ratio structure through the insulation structure, the high aspect ratio structure exposing the object; and
   forming at least one phase change material layer in the high aspect ratio structure by depositing at least one phase change material on the insulation structure and the object at a temperature greater than about 60% of a melting point temperature of the at least one phase change material.

2. The method of claim 1, wherein the at least one phase change material layer is formed by a physical vapor deposition (PVD) process.

3. The method of claim 1, wherein the at least one phase change material layer is formed by a sputtering process.

4. The method of claim 1, wherein forming the at least one phase change material layer comprises adding dopants into the at least one phase change material.

5. The method of claim 1, furthering comprising:
   forming at least one of a wetting layer and a seed layer on the object, a sidewall of the high aspect ratio structure, and the insulation structure before forming the at least one phase change material layer.

6. The method of claim 1, wherein the high aspect ratio structure comprises a hole, an opening or a trench having an aspect ratio of about 4.0 to about 1.7 defined by a depth of a structure divided by a width of the structure at an opening thereof or the depth of the structure divided by a width of the structure at a bottom thereof.

7. The method of claim 1, wherein forming the at least one phase change material layer comprises:
   forming a first phase change material layer partially filling the high aspect ratio structure; and
   forming a second phase change material layer on the first phase change material layer to fill the high aspect ratio structure.

8. The method of claim 7, wherein the first phase change material layer is formed by depositing a first phase change material on the object and the insulation structure at a first temperature, and the second phase change material layer is formed by depositing a second phase change material on the first phase change material layer at a second temperature greater than the first temperature.

9. The method of claim 8, wherein the first phase change material and the second phase change material have different compositions.

10. The method of claim 8, wherein the first temperature is less than about 60% of a melting point temperature of the first phase change material and the second temperature is greater than about 60% of a melting point temperature of the second phase change material.

11. The method of claim 10, wherein the first phase change material layer is formed by a first PVD process and the second phase change material layer is formed by a second PVD process.

12. The method of claim 7, wherein the first phase change material layer and the second phase change material layer are formed in-situ.

13. The method of claim 12, wherein the first phase change material layer and the second phase change material layer are formed using source targets having an identical composition.

14. A method of manufacturing a phase change memory device, comprising:
   forming a contact region in a substrate;
   forming an insulation layer on the substrate, the insulation layer including an opening exposing the contact region;
   forming a lower electrode in the opening;
   forming an insulation structure on the insulation layer, the insulation structure including a high aspect ratio structure exposing the lower electrode;
   forming at least one phase change material layer on the insulation structure to fill the high aspect ratio structure by depositing at least one phase change material at a temperature greater than about 60% of a melting point temperature of the at least one phase change material;
   forming at least one phase change material layer pattern in the high aspect ratio structure by partially removing the at least one phase change material layer; and
   forming an upper electrode on the at least one phase change material layer pattern.

15. The method of claim 14, further comprising forming a switching device in the opening before forming the lower electrode.

16. The method of claim 14, further comprising forming at least one of a wetting layer and a seed layer on a sidewall of the high aspect ratio structure and the lower electrode before forming the at least one phase change material layer.

17. The method of claim 14, wherein the high aspect ratio structure comprises a hole, an opening or a trench having an aspect ratio of about 4.0 to about 1.7 defined by a depth of a structure divided by a width of the structure at an opening thereof or the depth of the structure divided by a width of the structure at a bottom thereof.

18. The method of claim 14, wherein forming the at least one phase change material layer comprises:
- forming a first phase change material layer partially filling the high aspect ratio structure by depositing a first phase change material at a first temperature; and
- forming a second phase change material layer on the first phase change material layer to fill the high aspect ratio structure by depositing a second phase change material on the first phase change material layer at a second temperature greater than the first temperature.

19. The method of claim 18, wherein the first temperature is less than about 60% of a melting point temperature of the first phase change material and the second temperature is greater than about 60% of a melting point temperature of the second phase change material.

20. The method of claim 18, wherein the first phase change material and the second phase change material have different compositions.

* * * * *